(12) United States Patent
Lai et al.

(10) Patent No.: US 7,473,589 B2
(45) Date of Patent: Jan. 6, 2009

(54) STACKED THIN FILM TRANSISTOR, NON-VOLATILE MEMORY DEVICES AND METHODS FOR FABRICATING THE SAME

(75) Inventors: Erh Kun Lai, Taichung (TW); Hang-Ting Lue, Hsinchu (TW); Kuang Yeu Hsieh, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 47 days.

(21) Appl. No.: 11/549,520

(22) Filed: Oct. 13, 2006

(65) Prior Publication Data

US 2007/0134876 A1 Jun. 14, 2007

Related U.S. Application Data

(60) Provisional application No. 60/748,911, filed on Dec. 9, 2005.

(51) Int. Cl.
*H01L 21/00* (2006.01)
*H01L 21/84* (2006.01)

(52) U.S. Cl. .................. 438/149; 438/257; 257/E21.17; 257/E21.21; 257/E21.32; 257/E21.293; 257/E21.267; 257/E21.411; 257/E21.646

(58) Field of Classification Search .................. 438/149, 438/238, 381, 257, 311, 261, 724, 745, 752, 438/763, 687, 688, 933, 954, 680
See application file for complete search history.

(56) References Cited

U.S. PATENT DOCUMENTS

| | | |
|---|---|---|
| 4,630,086 A | 12/1986 | Sato et al. |
| 4,959,812 A | 9/1990 | Momodomi et al. |
| 5,270,969 A | 12/1993 | Iwahashi et al. |
| 5,278,439 A | 1/1994 | Ma et al. |
| 5,286,994 A | 2/1994 | Ozawa et al. |
| 5,319,229 A | 6/1994 | Shimoji et al. |
| 5,338,952 A | 8/1994 | Yamauchi |
| 5,355,464 A | 10/1994 | Fandrich et al. |
| 5,408,115 A | 4/1995 | Chang |
| 5,412,603 A | 5/1995 | Schreck et al. |
| 5,424,569 A | 6/1995 | Prall |

(Continued)

FOREIGN PATENT DOCUMENTS

EP 0016246 10/1980

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner*—David Nhu
(74) *Attorney, Agent, or Firm*—Haynes Beffel & Wolfeld LLP

(57) ABSTRACT

A manufacturing method for stacked, non-volatile memory device provides a plurality of bitline layers and wordline layers with charge trapping structures. The bitline layers have a plurality of bitlines formed on an insulating layer, such as silicon on insulator technologies. The wordline layers are patterned with respective pluralities of wordlines and charge trapping structures, orthoganal to the bitlines.

47 Claims, 21 Drawing Sheets

U.S. PATENT DOCUMENTS

| | | | |
|---|---|---|---|
| 5,448,517 A | 9/1995 | Iwahashi et al. | |
| 5,483,486 A | 1/1996 | Javanifard et al. | |
| 5,485,422 A | 1/1996 | Bauer et al. | |
| 5,509,134 A | 4/1996 | Fandrich et al. | |
| 5,515,324 A | 5/1996 | Tanaka et al. | |
| 5,566,120 A | 10/1996 | D'Souza | |
| 5,602,775 A | 2/1997 | Vo | |
| 5,644,533 A | 7/1997 | Lancaster et al. | |
| 5,668,029 A * | 9/1997 | Huang et al. | 438/278 |
| 5,694,356 A | 12/1997 | Wong et al. | |
| 5,745,410 A | 4/1998 | Yiu et al. | |
| 5,753,950 A | 5/1998 | Kojima et al. | |
| 5,768,192 A | 6/1998 | Eitan et al. | |
| RE35,838 E | 7/1998 | Momodomi et al. | |
| 5,793,677 A | 8/1998 | Hu | |
| 5,835,396 A * | 11/1998 | Zhang | 365/51 |
| 5,877,054 A | 3/1999 | Yamauchi et al. | |
| 5,883,409 A * | 3/1999 | Guterman et al. | 257/316 |
| 5,895,949 A | 4/1999 | Endoh et al. | |
| 5,952,692 A | 9/1999 | Nakazato et al. | |
| 5,966,603 A | 10/1999 | Eitan et al. | |
| 6,011,725 A | 1/2000 | Eitan et al. | |
| 6,026,026 A | 2/2000 | Chan et al. | |
| 6,034,896 A | 3/2000 | Ranaweera et al. | |
| 6,074,917 A | 6/2000 | Chang et al. | |
| 6,096,603 A | 8/2000 | Chang et al. | |
| 6,103,572 A | 8/2000 | Kirihara et al. | |
| 6,151,248 A | 11/2000 | Harari et al. | |
| 6,169,693 B1 | 1/2001 | Chan et al. | |
| 6,172,907 B1 | 1/2001 | Jenne | |
| 6,194,272 B1 | 2/2001 | Sung et al. | |
| 6,215,148 B1 | 4/2001 | Eitan et al. | |
| 6,218,700 B1 | 4/2001 | Papadas et al. | |
| 6,219,276 B1 | 4/2001 | Parker | |
| 6,289,175 B1 | 9/2001 | De'Longhi | |
| 6,297,096 B1 | 10/2001 | Boaz et al. | |
| 6,320,786 B1 | 11/2001 | Chang et al. | |
| 6,322,903 B1 * | 11/2001 | Soniaguine et al. | 428/617 |
| 6,356,478 B1 | 3/2002 | McCollum | |
| 6,363,013 B1 | 3/2002 | Lu et al. | |
| 6,396,741 B1 | 5/2002 | Bloom et al. | |
| 6,436,768 B1 | 8/2002 | Yang et al. | |
| 6,458,642 B1 | 10/2002 | Yeh et al. | |
| 6,487,114 B2 | 11/2002 | Jong et al. | |
| 6,512,696 B1 | 1/2003 | Fan et al. | |
| 6,522,585 B2 | 2/2003 | Pasternak | |
| 6,538,923 B1 | 3/2003 | Parker | |
| 6,552,386 B1 | 4/2003 | Wu et al. | |
| 6,566,699 B2 | 5/2003 | Eitan et al. | |
| 6,587,903 B2 | 7/2003 | Roohparvar | |
| 6,614,070 B1 | 9/2003 | Hirose et al. | |
| 6,614,694 B1 | 9/2003 | Yeh et al. | |
| 6,617,639 B1 * | 9/2003 | Wamg et al. | 257/324 |
| 6,643,181 B2 | 11/2003 | Sofer et al. | |
| 6,643,185 B1 | 11/2003 | Wang et al. | |
| 6,645,813 B1 | 11/2003 | Hsieh et al. | |
| 6,646,924 B1 | 11/2003 | Tsai et al. | |
| 6,653,712 B2 | 11/2003 | Knall | |
| 6,653,733 B1 * | 11/2003 | Gonzalez et al. | 257/758 |
| 6,657,252 B2 | 12/2003 | Fried et al. | |
| 6,657,894 B2 | 12/2003 | Yeh et al. | |
| 6,670,240 B2 | 12/2003 | Ogura et al. | |
| 6,670,671 B2 | 12/2003 | Sasago et al. | |
| 6,674,138 B1 | 1/2004 | Halliyal et al. | |
| 6,677,200 B2 | 1/2004 | Lee et al. | |
| 6,690,601 B2 | 2/2004 | Yeh et al. | |
| 6,709,928 B1 | 3/2004 | Jenne et al. | |
| 6,714,457 B1 | 3/2004 | Hsu et al. | |
| 6,720,614 B2 | 4/2004 | Lin et al. | |
| 6,720,630 B2 | 4/2004 | Mandelman et al. | |
| 6,731,544 B2 | 5/2004 | Han | |
| 6,734,065 B2 | 5/2004 | Yim et al. | |
| 6,744,105 B1 | 6/2004 | Chen et al. | |
| 6,750,525 B2 | 6/2004 | Yim et al. | |
| 6,784,480 B2 | 8/2004 | Bhattacharyya | |
| 6,795,357 B1 | 9/2004 | Liu et al. | |
| 6,798,012 B1 | 9/2004 | Ma et al. | |
| 6,815,805 B2 | 11/2004 | Weimer | |
| 6,818,558 B1 | 11/2004 | Rathor et al. | |
| 6,825,523 B2 | 11/2004 | Caprara | |
| 6,829,175 B2 | 12/2004 | Tsai et al. | |
| 6,841,813 B2 | 1/2005 | Walker et al. | |
| 6,856,551 B2 | 2/2005 | Mokhlesi et al. | |
| 6,858,899 B2 * | 2/2005 | Mahajani et al. | 257/347 |
| 6,858,906 B2 | 2/2005 | Lee et al. | |
| 6,885,044 B2 | 4/2005 | Ding | |
| 6,888,750 B2 | 5/2005 | Walker et al. | |
| 6,891,262 B2 | 5/2005 | Nomoto | |
| 6,897,514 B2 | 5/2005 | Kounetsov | |
| 6,897,533 B1 | 5/2005 | Yang et al. | |
| 6,911,691 B2 | 6/2005 | Tomiie | |
| 6,912,163 B2 | 6/2005 | Zheng et al. | |
| 6,925,007 B2 | 8/2005 | Harari et al. | |
| 6,927,448 B2 | 8/2005 | Liu et al. | |
| 6,933,555 B2 | 8/2005 | Hsieh et al. | |
| 6,937,511 B2 | 8/2005 | Hsu et al. | |
| 6,942,320 B2 | 9/2005 | Chung et al. | |
| 6,970,383 B1 | 11/2005 | Han et al. | |
| 6,977,201 B2 | 12/2005 | Jung et al. | |
| 6,995,424 B2 | 2/2006 | Lee et al. | |
| 6,996,011 B2 | 2/2006 | Yeh et al. | |
| 7,005,366 B2 | 2/2006 | Chau et al. | |
| 7,009,882 B2 | 3/2006 | Chen | |
| 7,012,297 B2 | 3/2006 | Bhattacharyya | |
| 7,015,540 B2 | 3/2006 | Ishii | |
| 7,018,895 B2 | 3/2006 | Ding | |
| 7,026,682 B2 | 4/2006 | Chung et al. | |
| 7,042,045 B2 | 5/2006 | Kang et al. | |
| 7,057,234 B2 * | 6/2006 | Tiwari | 257/324 |
| 7,071,061 B1 | 7/2006 | Pittikoun et al. | |
| 7,075,828 B2 | 7/2006 | Lue et al. | |
| 7,078,762 B2 | 7/2006 | Ishii | |
| 7,106,625 B2 | 9/2006 | Yeh et al. | |
| 7,115,469 B1 | 10/2006 | Halliyal et al. | |
| 7,115,942 B2 | 10/2006 | Wang | |
| 7,120,059 B2 | 10/2006 | Yeh et al. | |
| 7,129,538 B2 * | 10/2006 | Lee et al. | 257/321 |
| 7,133,313 B2 | 11/2006 | Shih et al. | |
| 7,133,317 B2 | 11/2006 | Liao et al. | |
| 7,135,734 B2 | 11/2006 | Eldridge et al. | |
| 7,151,692 B2 | 12/2006 | Wu et al. | |
| 7,154,143 B2 | 12/2006 | Jung et al. | |
| 7,154,779 B2 | 12/2006 | Mokhlesi et al. | |
| 7,157,769 B2 | 1/2007 | Forbes | |
| 7,158,420 B2 | 1/2007 | Lung | |
| 7,164,603 B2 | 1/2007 | Shih et al. | |
| 7,166,513 B2 | 1/2007 | Hsu et al. | |
| 7,187,590 B2 | 3/2007 | Zous et al. | |
| 7,190,614 B2 | 3/2007 | Wu et al. | |
| 7,209,386 B2 | 4/2007 | Yeh et al. | |
| 7,209,389 B2 | 4/2007 | Lung et al. | |
| 7,209,390 B2 | 4/2007 | Lue et al. | |
| 7,242,622 B2 | 7/2007 | Hsu et al. | |
| 7,250,646 B2 * | 7/2007 | Walker et al. | 257/278 |
| 7,279,740 B2 | 10/2007 | Bhattacharyya et al. | |
| 2001/0012663 A1 | 8/2001 | Magri' et al. | |
| 2001/0045615 A1 | 11/2001 | Ajit | |
| 2001/0055838 A1 * | 12/2001 | Walker et al. | 438/129 |
| 2002/0167844 A1 | 11/2002 | Han et al. | |
| 2002/0179958 A1 | 12/2002 | Kim | |
| 2003/0023603 A1 | 1/2003 | Ellison et al. | |
| 2003/0025147 A1 | 2/2003 | Nomoto et al. | |
| 2003/0030100 A1 | 2/2003 | Lee et al. | |
| 2003/0032242 A1 | 2/2003 | Lee et al. | |

| | | |
|---|---|---|
| 2003/0036250 A1 | 2/2003 | Lin et al. |
| 2003/0042534 A1 | 3/2003 | Bhattacharyya |
| 2003/0047755 A1 | 3/2003 | Lee et al. |
| 2003/0067032 A1 | 4/2003 | Caprara et al. |
| 2003/0146465 A1 | 8/2003 | Wu |
| 2003/0185055 A1 | 10/2003 | Yeh et al. |
| 2003/0224564 A1 | 12/2003 | Kang et al. |
| 2004/0079983 A1 | 4/2004 | Chae et al. |
| 2004/0084714 A1 | 5/2004 | Ishii et al. |
| 2004/0119122 A1 | 6/2004 | Ilkbahar |
| 2004/0125629 A1 | 7/2004 | Scheuerlein et al. |
| 2004/0145024 A1 | 7/2004 | Chen et al. |
| 2004/0183126 A1 | 9/2004 | Bae et al. |
| 2004/0256679 A1 | 12/2004 | Hu |
| 2005/0001258 A1 | 1/2005 | Forbes |
| 2005/0006696 A1 | 1/2005 | Noguchi et al. |
| 2005/0023603 A1 | 2/2005 | Eldridge et al. |
| 2005/0062091 A1 | 3/2005 | Ding |
| 2005/0074937 A1 | 4/2005 | Jung |
| 2005/0093054 A1 | 5/2005 | Jung |
| 2005/0218522 A1 | 10/2005 | Nomoto et al. |
| 2005/0219906 A1 | 10/2005 | Wu |
| 2005/0237801 A1 | 10/2005 | Shih |
| 2005/0237809 A1 | 10/2005 | Shih et al. |
| 2005/0237813 A1 | 10/2005 | Zous et al. |
| 2005/0237815 A1 | 10/2005 | Lue et al. |
| 2005/0237816 A1 | 10/2005 | Lue et al. |
| 2005/0255652 A1 | 11/2005 | Nomoto et al. |
| 2005/0270849 A1 | 12/2005 | Lue |
| 2005/0281085 A1 | 12/2005 | Wu |
| 2006/0007732 A1 | 1/2006 | Yeh |
| 2006/0044872 A1 | 3/2006 | Nazarian |
| 2006/0088983 A1 | 4/2006 | Fujisawa et al. |
| 2006/0197145 A1 | 9/2006 | Pittikoun et al. |
| 2006/0198189 A1 | 9/2006 | Lue et al. |
| 2006/0198190 A1 | 9/2006 | Lue |
| 2006/0202252 A1 | 9/2006 | Wang et al. |
| 2006/0202256 A1 | 9/2006 | Harari |
| 2006/0202261 A1 | 9/2006 | Lue et al. |
| 2006/0234446 A1 | 10/2006 | Wei et al. |
| 2006/0245246 A1 | 11/2006 | Lung |
| 2006/0258090 A1 | 11/2006 | Bhattacharyya et al. |
| 2006/0261401 A1 | 11/2006 | Bhattacharyya |
| 2006/0275986 A1 | 12/2006 | Kobayashi et al. |
| 2006/0281260 A1 | 12/2006 | Lue |
| 2007/0012988 A1 | 1/2007 | Bhattacharyya |
| 2007/0029625 A1 | 2/2007 | Lue et al. |
| 2007/0031999 A1 | 2/2007 | Ho et al. |
| 2007/0032018 A1 | 2/2007 | Tuntasood et al. |
| 2007/0045718 A1 | 3/2007 | Bhattacharyya |
| 2007/0069283 A1 | 3/2007 | Shih et al. |
| 2007/0076477 A1 | 4/2007 | Hwang et al. |
| 2007/0117323 A1 | 5/2007 | Yeh |
| 2007/0138539 A1 | 6/2007 | Wu et al. |

FOREIGN PATENT DOCUMENTS

| | | |
|---|---|---|
| EP | 1411555 | 4/2004 |
| EP | 1689002 | 8/2006 |
| JP | 09162313 | 6/1997 |
| JP | 11040682 | 2/1999 |
| JP | 11233653 | 8/1999 |
| JP | 2002368141 | 12/2002 |
| JP | 2004363329 | 12/2004 |
| WO | WO-9428551 | 12/1994 |
| WO | WO-0137347 | 5/2001 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4 (2003).

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Bude, J.D., et al., "Secondary Electron Flash—a High Performance, Low Power Flash Technology for 0.35 um and Below," IEEE IEDM 1997, 11.3.1-11.3.4.

Chang, Kuo-Tung, et al., "A New SONOS Memory Using Source-Side Injection for Programming," IEEE Electron Device Letters, vol. 19, No. 7, Jul. 1998, 253-255.

Chindalore et al., "A New Combination-Erase Technique for Erasing Nitride Based (SONOS) Nonvolatile Memories," IEEE Electron Dev Lett 24(4) Apr. 2003, 257-259.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Chung, Steve S., et al., "A Novel Leakage Current Separation Technique in a Direct Tunneling Regime Gate Oxide SONOS Memory Cell," Electron Devices Meeting, 2003. IEDM '03 Technical Digest. IEEE International , Dec. 8-10, 2003 pp. 26.6.1-26.6.4.

Chung, Steve S., "Low Voltage/Power and High Speed Flash Memory Technology for High Performance and Reliability," The 3rd WIMNACT—Singapore, Oct. 15, 2003, 1-48.

De Blauwe, Jan, "Nanocrystal Nonvolatile Memory Devices," IEEE Transactions on Nanotechnology, vol. 1, No. 1, Mar. 2002, 72-77.

DiMaria, D.J., et al., "Conduction Studies in Silicon Nitride: Dark Currents and Photocurrents," IBM J. Res. Dev. May 1977, 227-244.

Eitan, Boaz, "Can NROM, a 2-bit, Trapping Storage NVM Cell, Give a Real Challenge to Floating Gate Cells?" SSDM, Tokyo, Japan (1999), 3 pages.

Eitan et al., "NROM: A Novel Localized Trapping, 2-Bit Nonvolatile Memory Cell," IEEE Electron Device Lett 21(11) Nov. 2000, 543-545.

Fujiwara, I., et al., "0.13 µm MONOS single transistor memory cell with deparated source lines," IEDM 1998, 995-998.

Govoreanu et al., "An Investigation of the Electron Tunneling Leakage Current through Ultathin Oxides/High-k Gate Stacks at Inversion Conditions," IEEE SISPAD Int'l Conf. Sep. 3-5, 2003, 287-290.

Govoreanu et al., "Simulation of Nanofloating Gate Memory with High-k Stacked Dielectrics," IEEE SISPAD Int'l Conf. 305 Sep. 2003, 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, pluse 24 pages from outline.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Janai, Meir, "Data Retention, Endurance and Acceleration Factors of NROM Devices," IEEE 41st Annual International Reliability Physics Symposium, Dallas, Texas, 2003, 502-505.

Kim et al., "Robust Multi-bit Programmable Flash Memory Using a Resonant Tunnel Barrier," Electron Dev. Mtg. Dec. 5-7, 2005, IEDM Tech Dig. 861-864.

Kobayashi, T., et al., "A Giga-Scale Assist-Gate (AG)-AND-Type Flash Memory Cell with 20-MB/s Programming Throughput for Content-Downloading Applications," IEDM 2001, 2.2.1-2.2.4.

Lahiri, S. K., "MNOS/Floating-Gate Charge Coupled Devices for High Density EEPROMS: A New Concept", Physics of Semiconductor Devices, Dec. 1997, pp. 951-956, vol. 3316, No. 2.

Lee, Chang, et al., "A Novel SONOS Structure of SiO2/SiN/Al2O3 with TaN Metal Gate for Multi-Giga Bit Flash Memeries," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6..4 (2003).

Lee, Jae-duk, et al., "Effects of Floating-Gate Interference on NAND Flash Memory Cell Operation," IEEE Electron Device Letters, vol. 23, No. 5, May 2002, 264-266.

Likharev, "Layered Tunnel Barriers for Nonvolatile Memory Devices," Appl. Phys. Lett. 73(15) Oct. 1998 2137-2139.

Liu, Zhizheng et al., "A New Programming Technique for Flash Memory Devices," International Symposium on VLSI Technology, Systems and Applications, Jun. 8-10, 1999, 195-198.

Lue et al., "A Novel P-Channel NAND-Type Flash memory with 2-bit/cell Operation and High Programming Throughput (>20 MB/sec)," IEEE 2005, 4 pages.

Lue et al., "BE-SONOS: A Bandgap Engineered SONOS with Excellent Performance and Reliability," IEDM Tech Digest, IEEE Int'l Dec. 2005, 547-550.

Minami et al., "New Scaling Guidelines for MNOS Nonvolatile Memory Devices," IEEE Trans on Electron Devices 38(11) Nov. 1991 2519-2526.

Rippard, W.H., et al., "Ultrathin Aluminum Oxide Tunnel Barriers," Phys. Rev. Lett. 88(4), Jan. 28, 2002, 4 pages.

Sasago, Y. et al., "90-nm-node multi-level AG-AND type flash memory with cell size of true 2 F/sup 2//bit and programming throughput of 10 MB/s," IEDM, 2003, pp. 823-826.

Shih et al., "A Novel 2-bit/cell Nitride Storage Flash memory with Greater than 1M P/E-cycle Endurance," IEEE IEDM 2004, pp. 36.3.1-36.3.4.

Shin, Yoocheol, et al., "High Reliable SONOS-type NAND Flash Memory Cell with Al2O3 for Top Oxide," Non-Volatile Semiconductor Memory Workshop, 2003, 2 pages.

Sung, et al., "Multi-layer SONOS with Direct Tunnel Oxide for High Speed and Long Retention Time," IEEE 2002 Nanoelectronics Workshop, Jun. 2002, 83-84.

Takata, M., et al., "New Non-Volatile Memory with Extremely High Density Metal Nano-Dots," IEEE IEDM 03-553, 22.5.1-22.5.4, date unknown.

Tsai, W.J., et al., "Data Retention Behavior of a SONOS Type Two-Bit Storage Flash Memory Cell," Electron Devices Meeting, 2001. IEDM Technical Digest. International , Dec. 2-5, 2001 pp. 32.6.1-32.6.4.

Walker, et al., "3D TFT-SONOS Memory Cell for Ultra-High Density File Storage Applications," 2003 Symposium on VLSI Tech Digest of Technical Papers, 29-30.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International , Dec. 8-10, 2003, pp. 7.4.1-7.4.4.

White, Marvin, H., et al., "On the Go with SONOS," Circuits and Devices Magazine, IEEE , vol. 16 , Issue: 4 , Jul. 2000, pp. 22-31.

Yamada, et al., "A self-convergence erasing scheme for a simple stacked gate flash EEPROM," Proc. of the Int'l Electron Dev. Mtg., IEEE Dec. 1991, 307-310.

Yeh, C.C., et al., "Novel Operation Schemes to Improve Device Reliability in a Localized Trapping Storage SONOS-type Flash Memory," Electron Devices Meeting, 2003. IEDM '03 Technical Digest. IEEE International , Dec. 8-10, 2003, pp. 7.5.1-7.5.4.

U.S. Appl. No. 60/585,657, filed Jul. 6, 2004, 33 pages.

U.S. Appl. No. 60/585,658, filed Jul. 6, 2004, 27 pages.

* cited by examiner

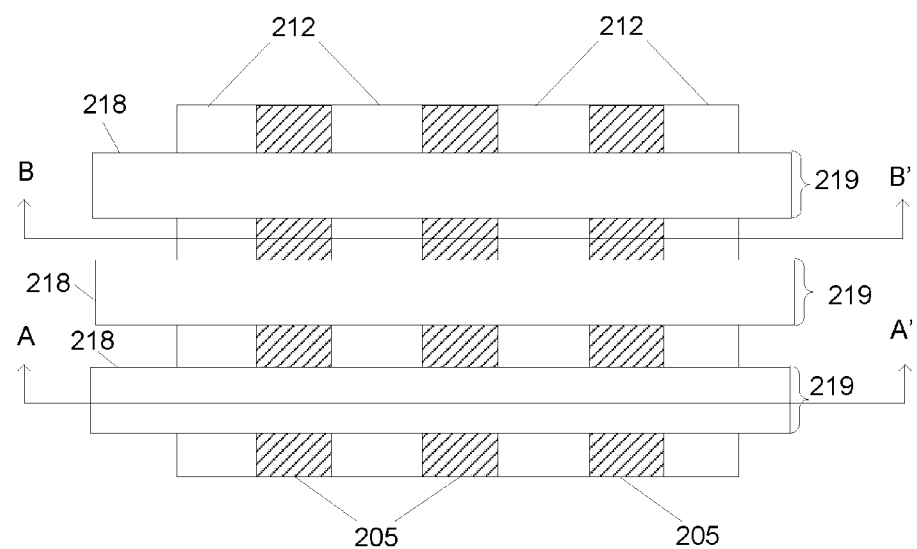
FIG. 12
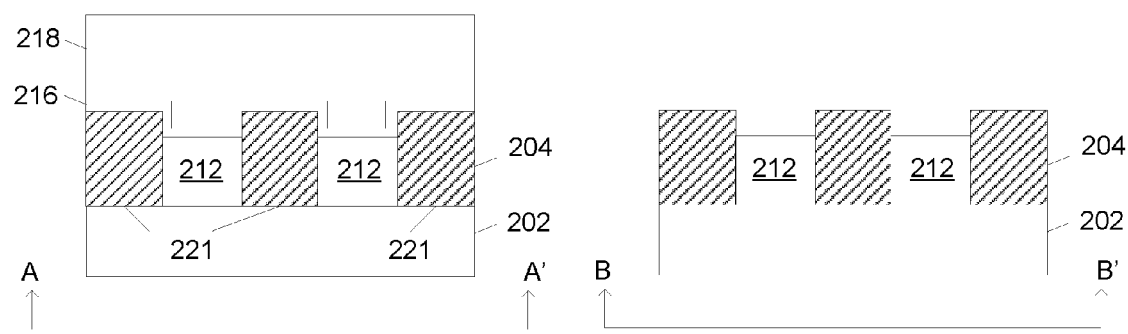
FIG. 13
FIG. 14

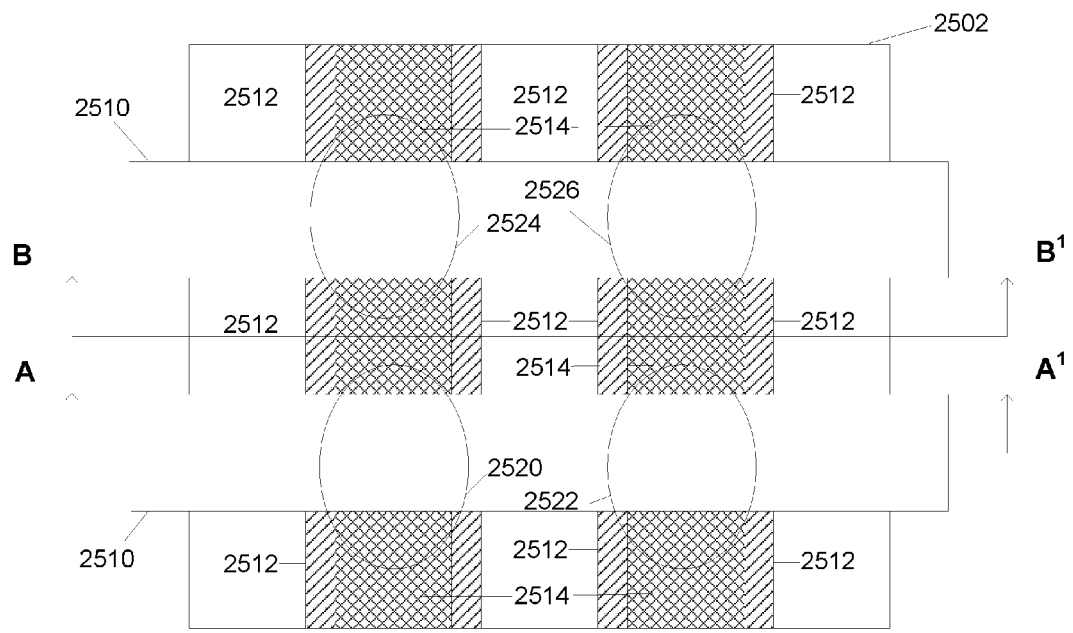
FIG. 30
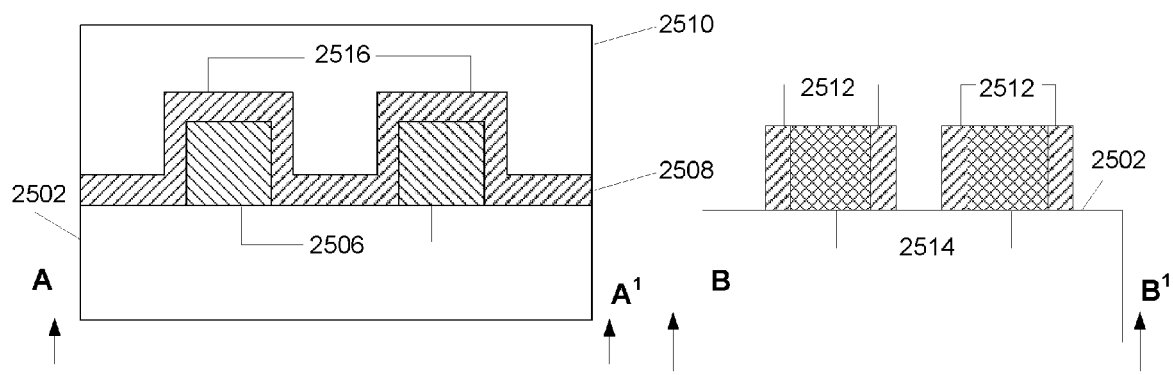
FIG. 28
FIG. 29

STACKED THIN FILM TRANSISTOR, NON-VOLATILE MEMORY DEVICES AND METHODS FOR FABRICATING THE SAME

RELATED APPLICATIONS INFORMATION

This application claims the benefit of U.S. Provisional Application Ser. No. 60/748,911, entitled "The Process of TFT NAND and Nitride Read Only Memory," filed Dec. 9, 2005, which is incorporated herein by reference as if set forth in full. This application is also related to U.S. patent application Ser. No. 11/425,959, entitled "A Stacked Non-Volatile Memory Device and Methods for Fabricating the Same," Filed Jun. 22, 2006, and which is also incorporated herein by reference as if set forth in full.

BACKGROUND

1. Field of the Invention

The embodiments described herein are directed to methods for fabricating a thin film transistor, non-volatile memory devices, and more particularly to methods for fabricating a thin film transistor, non-volatile memory device comprising multiple layers of memory cells.

2. Background of the Invention

Non-volatile memory devices are finding uses in more and more products. For example, flash-based memory devices are being used in MP3 players, digital cameras, as storage devices for computer files, etc. As these uses grow, there is a need for larger memories housed in smaller packages. This requires the fabrication of highly dense memories. Accordingly, research and development has been directed at increasing the density of conventional non-volatile memory devices.

One approach for increasing the density of non-volatile memory devices is to create a stacked memory device, i.e., a device in which layers of memory cells are stacked on top of each other. Unfortunately, to date little effort has been put into creating certain types of stacked memory devices. For example, there are few stacked nitride read-only memory designs. This is in part because stacked memory devices are not necessarily compatible with the latest fabrication processes, which can make fabricating a stacked memory device inefficient and costly.

There are other approaches to increasing the density of conventional non-volatile memory devices; however, these approaches do not necessarily address the needs of all applications. Accordingly, there is still a need for further, or other approaches for increasing the density of conventional non-volatile memory devices.

One particular type of non-volatile memory device is the nitride read-only memory device. FIG. 1 is a diagram illustrating a conventional nitride read-only memory structure 150. As can be seen, nitride read-only memory 150 is constructed on a silicon substrate 152. The silicon substrate can be a P-type silicon substrate or an N-type silicon substrate; however, for various design reasons P-type silicon substrates are often preferred. Source/drain regions 154 and 156 can then be implanted in substrate 152. A trapping structure 158 is then formed on substrate 152 between source/drain regions 154 and 156. Control gate 160 is then formed on top of trapping layer 158.

Source/drain regions 154 and 156 are silicon regions that are doped to be the opposite type as that of substrate 152. For example, where a P-type silicon substrate 152 is used, N-type source/drain regions 154 and 156 can be implanted therein.

Charge trapping structure 158 comprises a nitride trapping layer as well as an isolating oxide layer between the trapping layer and channel 166 in substrate 152. In other embodiments, trapping structure 158 can comprise a nitride trapping layer sandwiched between two isolating, or dielectric layers, such as oxide, or more specifically silicon dioxide layers. Such a configuration is often referred to as an Oxide-Nitride-Oxide (ONO) trapping layer.

Charge can be accumulated and confined within trapping structure 158 next to source/drain regions 154 and 156, effectively storing two separate and independent charges 162 and 164. Each charge 162 and 164 can be maintained in one of two states, either programmed or erased, represented by the presence or absence of a pocket of trapped electrons. This enables the storage of two bits of information without the complexities associated with multilevel cell technology.

Each storage area in nitride read-only memory cell 150 can be programmed independently of the other storage area. A nitride read-only memory cell is programmed by applying a voltage that causes negatively charged electrons to be injected into the nitride layer of trapping structure 158 near one end of the cell. Erasing is accomplished by applying voltages that cause holes to be injected into the nitride layer where they can compensate for electrons previously stored in the nitride layer during programming.

A nitride read only memory device is constructed by manufacturing arrays of memory cells such as the cell illustrated in FIG. 1. Arrays are constructed by tying the cells together via word and bit lines. The bit lines are often polysilicon lines, while the word lines can be polysilicon or metal.

While nitride read-only memory devices, such as the device illustrated in FIG. 1, can be configured to store multiple bits per cell, the density of nitride read-only memory devices can be increased by using a stacked construction. Unfortunately, the stacking of nitride read-only memory devices is rarely done and when it is, the process can be inefficient and therefore more costly.

SUMMARY

Methods for fabricating a stacked non-volatile memory device is disclosed. The methods disclosed use efficient processing techniques in order to fabricate a stacked device. Accordingly, the embodiments described herein can be scaled to achieve various levels of stacking.

In one aspect, a stacked nitride read-only memory can be fabricated using the methods described herein.

In another aspect, the stacked nitride read-only memory device can comprise thin film transistors (TFTs) fabricated using Silicon On Insulator (SOI) processing techniques.

In another aspect, a trapping layer included in the stacked non-volatile memory device can include one of a plurality of structures such as a SONOS, BE-SONOS, SONS, an Hi-K material, to name just a few.

In another aspect, a stacked memory device fabricated using the methods described herein can be configured for NAND operation.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 3-17 are diagrams illustrating an example progression of steps for fabricating the stacked nitride read-only memory of FIG. 2 in accordance with one embodiment;

FIGS. 21-31 are diagrams illustrating processing steps comprising an example process for fabricating the device of FIG. 24 in accordance with one embodiment;

DETAILED DESCRIPTION

It will be understood that any dimensions, measurements, ranges, test results, numerical data, etc., presented below are approximate in nature and unless otherwise stated not intended as precise data. The nature of the approximation involved will depend on the nature of the data, the context, and the specific embodiments or implementations being discussed.

Figure 2:
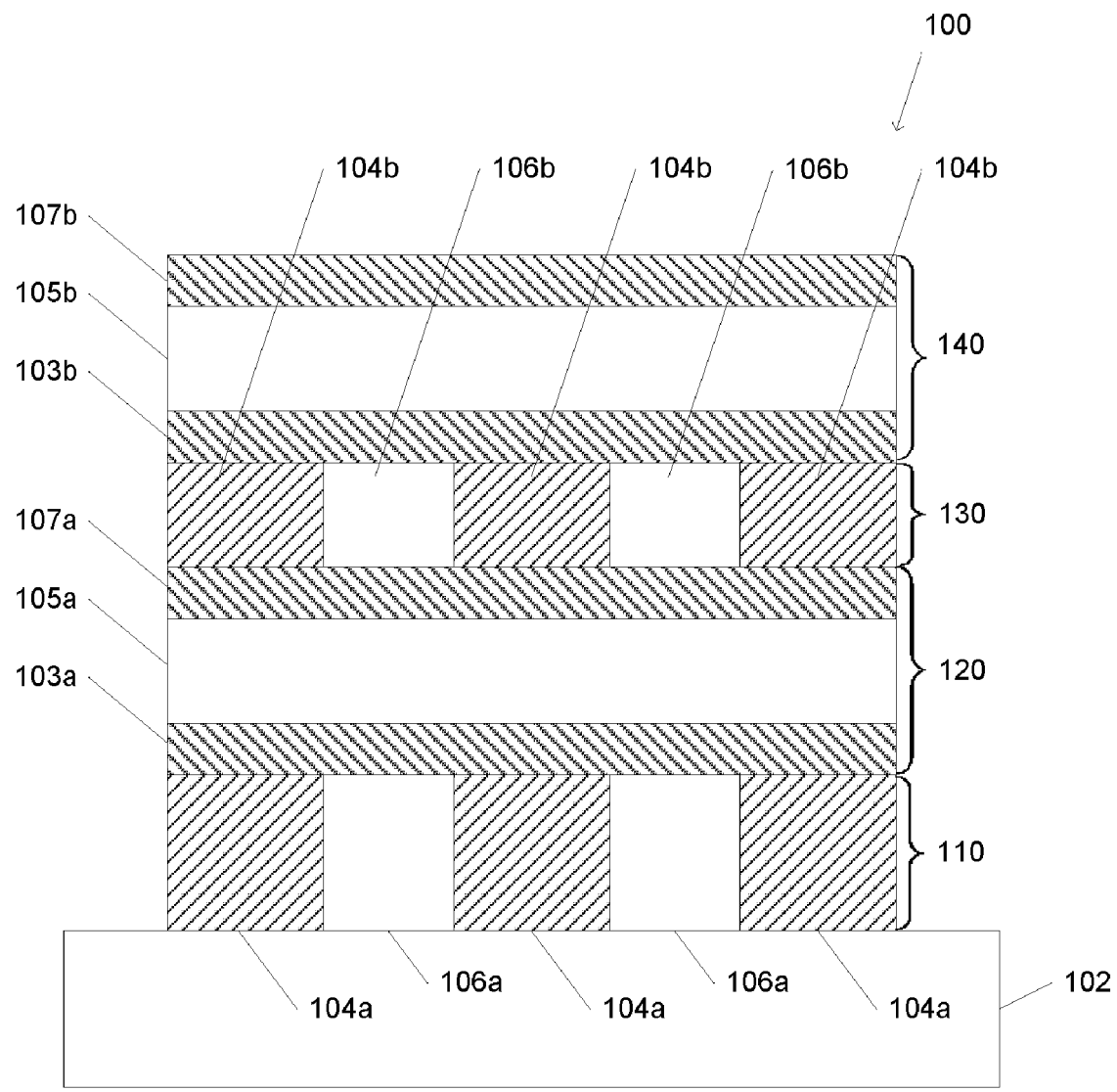
FIG. 2 is a diagram illustrating a stacked nitride read-only memory structure in accordance with one embodiment.

FIG. 2 is a diagram illustrating an example TFT, stacked nitride read-only memory 100 in accordance with one embodiment. In the example of FIG. 2, stacked nitride read-only memory 100 is fabricated on top of an insulating layer 102. Accordingly, device 100 is fabricated using SOI processing techniques. For example, device 100 can be fabricated using TFT processing techniques. A TFT is a special kind of field effect transistor made by depositing thin films for the metallic contacts, semiconductor active layer, and dielectric layer on an insulating layer. The channel region of a TFT is a thin film that is deposited onto a substrate that is often glass.

Successive bitline layers and wordline layers can then be fabricated on insulating layer 102. For example, in FIG. 2 a first bitline layer 110 is fabricated on insulating layer 102. A first wordline layer 120 is then fabricated on top of first bit layer 110. A second bitline layer 130 is then fabricated on top of first wordline layer 120. Finally, a second wordline layer 140 is fabricated on top of second bitline layer 130.

Figure 1:
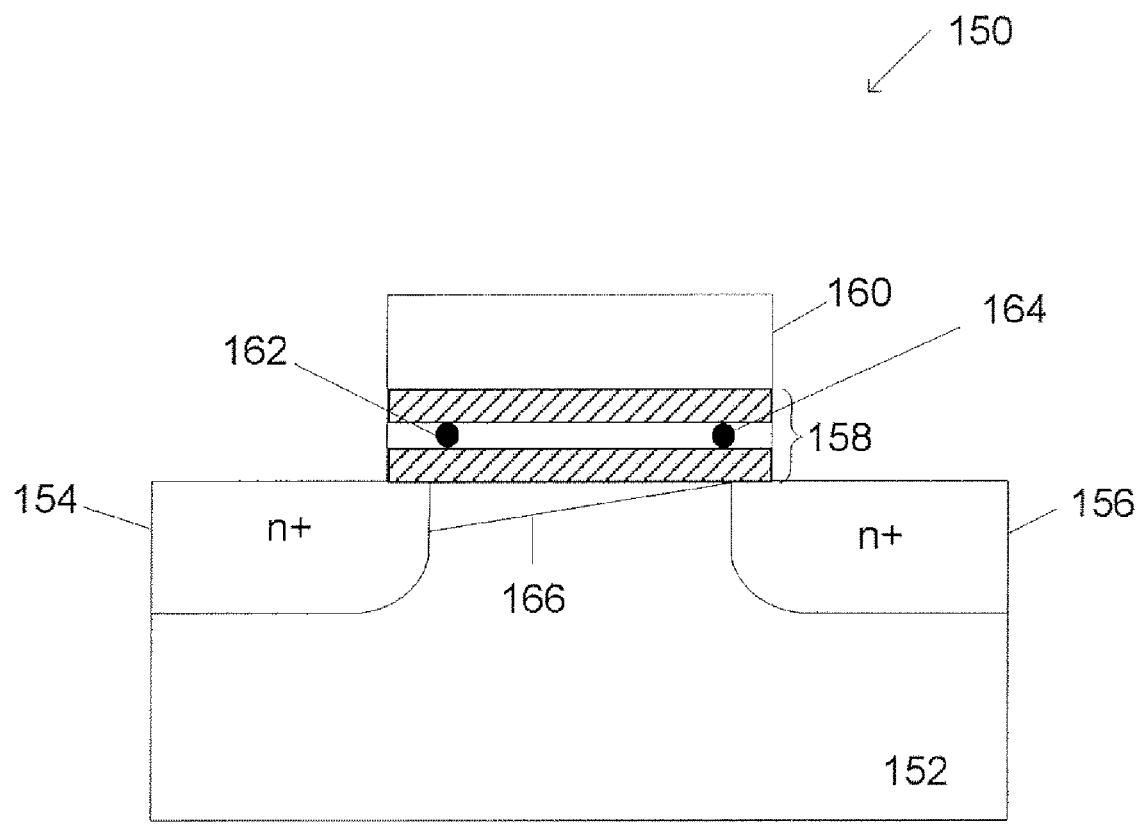
FIG. 1 is a diagram illustrating a conventional nitride read-only memory structure.

Further bitline and wordline layers can be successively fabricated on top of the layers illustrated in FIG. 1. Thus, two bitline layers and two wordline layers are shown for convenience only and the methods described herein should not be seen as limited to a certain number of bitline layers and/or wordline layers. Each bitline layer 110 and 130 comprises a plurality of bitlines 104 separated by insulating regions 106. Each wordline layer 120 and 140 comprises a wordline conductor 105 sandwiched between trapping layers 103 and 107.

By using the stacked configuration illustrated in FIG. 2, greater memory densities can be achieved. Further, as explained below, efficient processing techniques can be used to fabricate structure 100.

Figure 3:
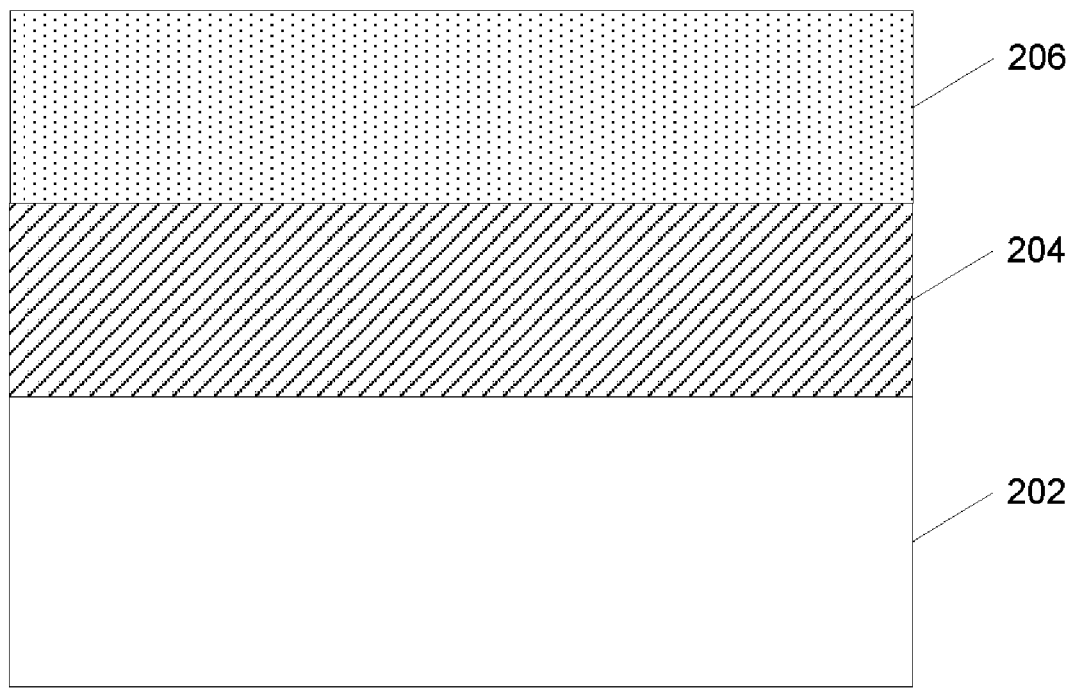

FIGS. 3-17 are diagrams illustrating an example sequence of steps for fabricating structure 100 in accordance with one embodiment. As illustrated in FIG. 3, a semiconductor layer 204 can be formed on an insulating layer 202. In certain embodiments, for example, insulating layer 202 can comprise an oxide material. Semiconductor layer 204 can comprise a P-type semiconductor material, such as silicon (Si), germanium (Ge), or silicon germanium (SiGe). It can be preferable, for example, for layer 204 to comprise a thin film polysilicon deposited on insulating layer 202. It will be understood that in other embodiments, semiconductor layer 204 can comprise N-type semiconductor material. A cap layer 206 can then be formed over semiconductor layer 204. In certain embodiments, for example, cap layer 206 can comprise a silicon nitride (SiN) material.

Figure 4:
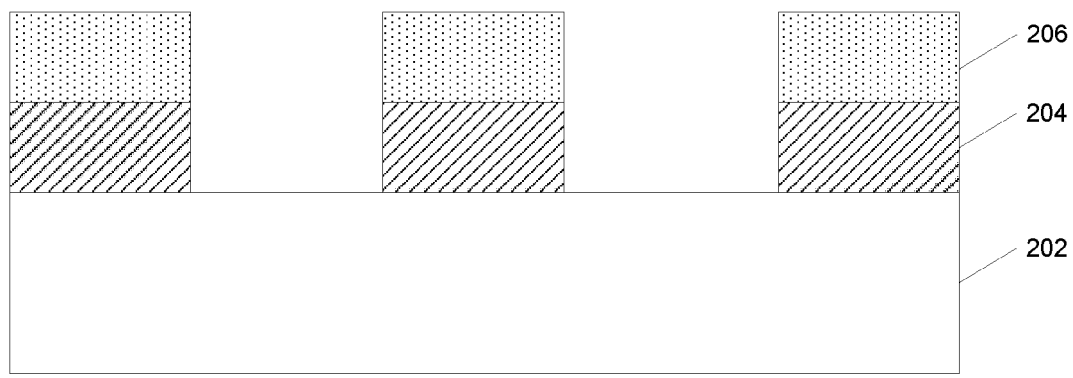
Figure 5:
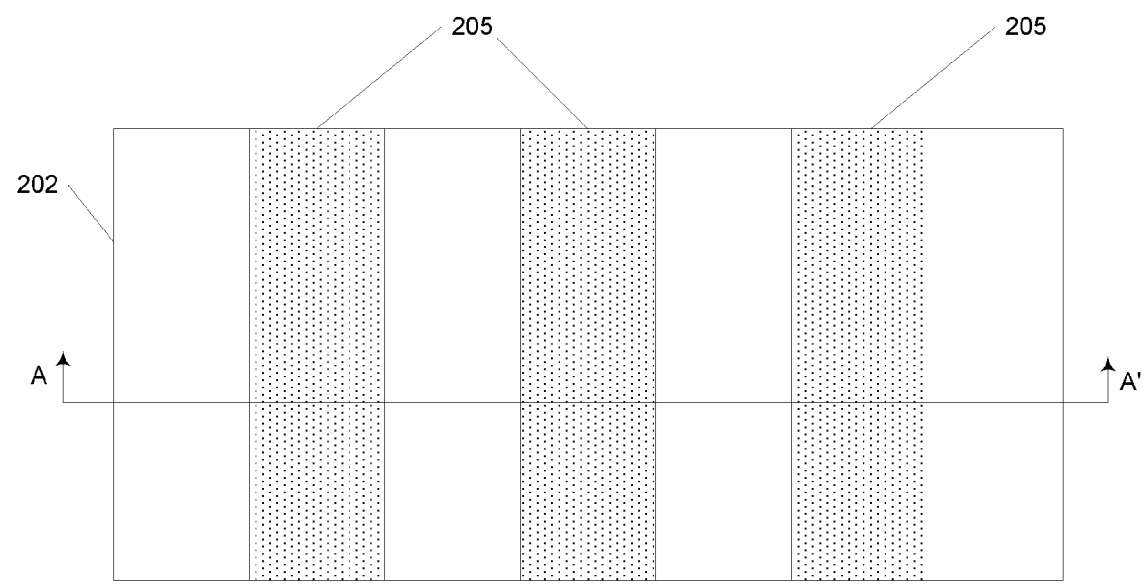

As illustrated in FIG. 4, conventional photolithography techniques can be used to pattern and etch layers 204 and 206. FIG. 5 is a diagram illustrating a top view of the layers comprising the device as fabricated to this point. FIG. 4 is a cross sectional view of FIG. 5 along the line AA'. Thus, as can be seen in FIG. 5, layer 206 and 204 have been patterned and etched into regions 205 that traverse insulating layer 202 from top to bottom. As will be explained below, regions 205 will form the bit lines of first bit line layer 110 shown in FIG. 2.

Figure 6:
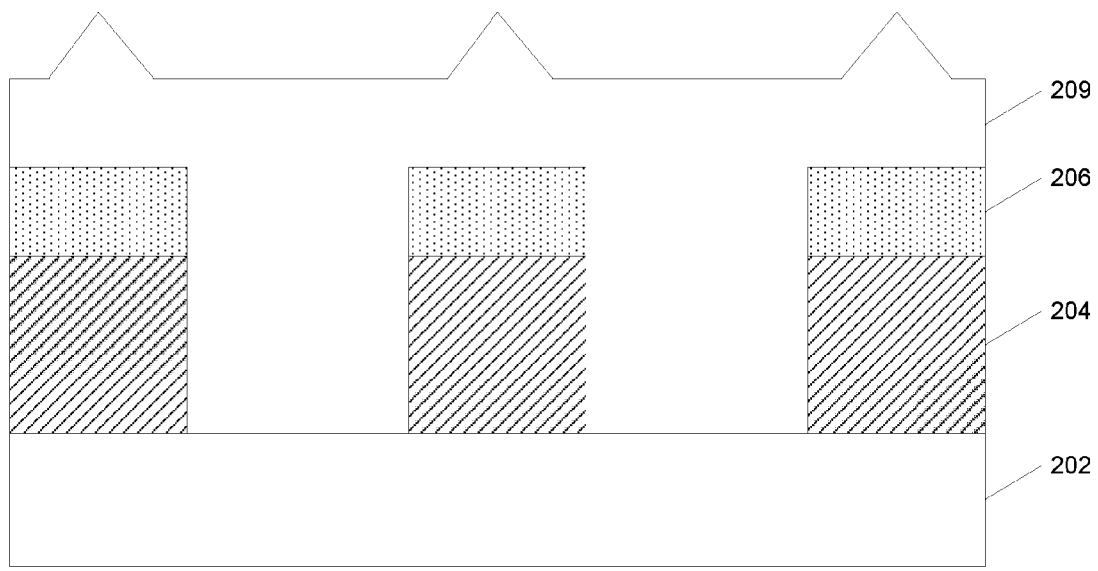
Figure 7:
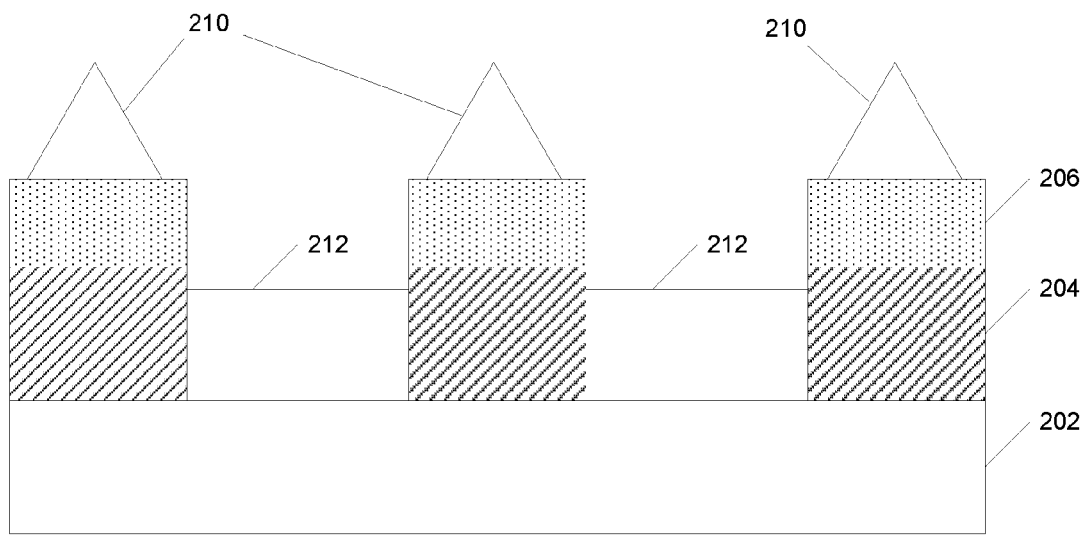

Referring to FIG. 6, a dielectric layer 209 can then be formed over insulating layer 202 as illustrated. Dielectric layer 209 can be, for example, an oxide, such as a silicon dioxide ($SiO_2$) layer and can be formed using High Density Plasma (HDP)—Chemical Vapor Deposition (CVD). Referring to FIG. 7, a portion of dielectric layer 209 is removed to expose the remaining portions of cap layer 206 and part of the remaining portions of semiconductor layer 204. For example, a conventional wet etching, i.e., isotropic, process can be used to remove a portion of dielectric layer 209. Removing the right amount of dielectric layer 209 can be achieved by having a high etching selectivity ratio between dielectric layer 209 and cap layer 206. The etching process produces dielectric regions 210 on top of cap layer 206 as well as dielectric regions 212 in between the remaining portions of semiconductor layer 204.

Figure 8:
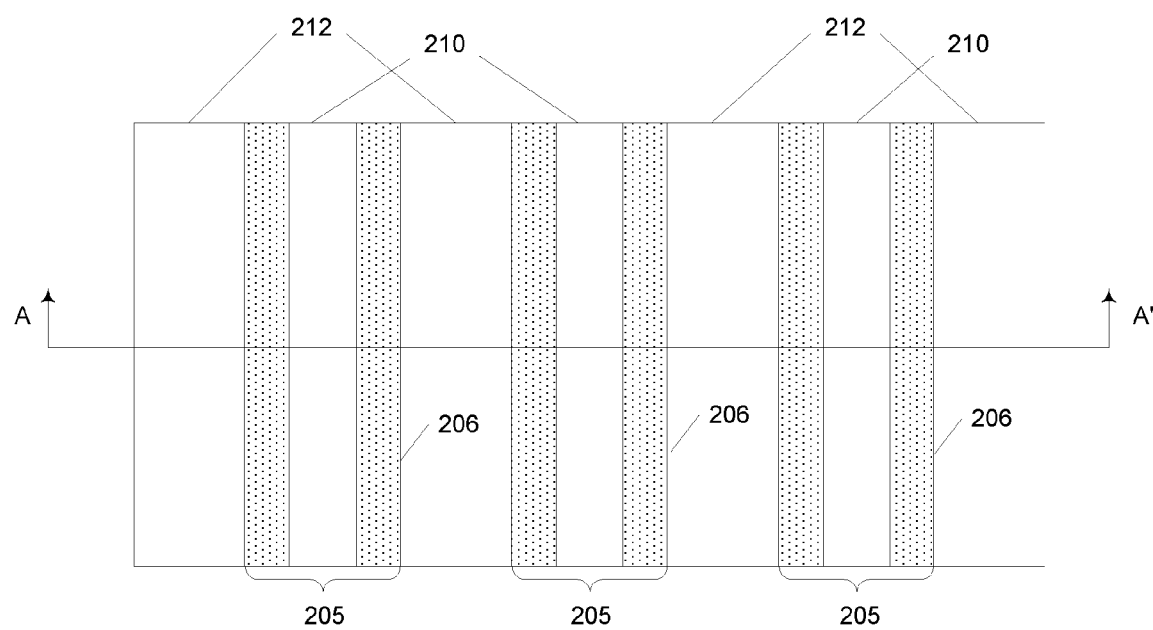

FIG. 8 is a diagram illustrating a top view of the layers as fabricated to this point. FIG. 7 is a cross-sectional view of the layers along the line AA'. Thus, as can be seen in FIG. 8, dielectric regions 212 now reside between regions 205. Dielectric regions 210 are illustrated as covering a portion of cap layer 206.

Figure 9:
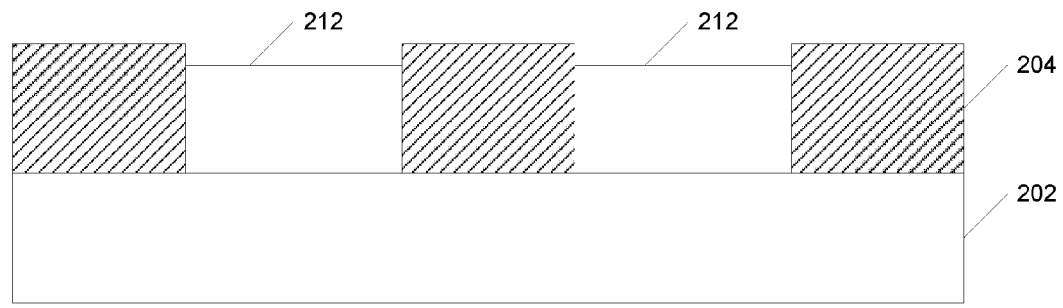

Referring to FIG. 9, the remaining portions of cap layer 206 can be removed, removing regions 210 of dielectric layer 209 in the process. For example, a hot phosphoric acid can be used to remove the remaining portions of cap layer 206. Regions 210 of dielectric layer 209 will automatically be removed during the removal of the remaining portions of cap layer 206, because portions 210 are disconnected from dielectric regions 212.

The process illustrated in FIGS. 6-9 are described in U.S. Pat. No. 6,380,068, entitled "Method for Planarizing a Flash Memory Device," assigned to the assignee of the present application, issued Apr. 30, 2002, and incorporated herein by references as if set forth in full. The process described in FIGS. 6-9 result in an efficient planarization of the remaining surfaces illustrated in FIG. 9. Accordingly, the fabrication processes described herein are compatible with newer, efficient processing techniques. This makes the fabrication of stacked non-volatile memory device efficient and cost-effective.

Figure 10:
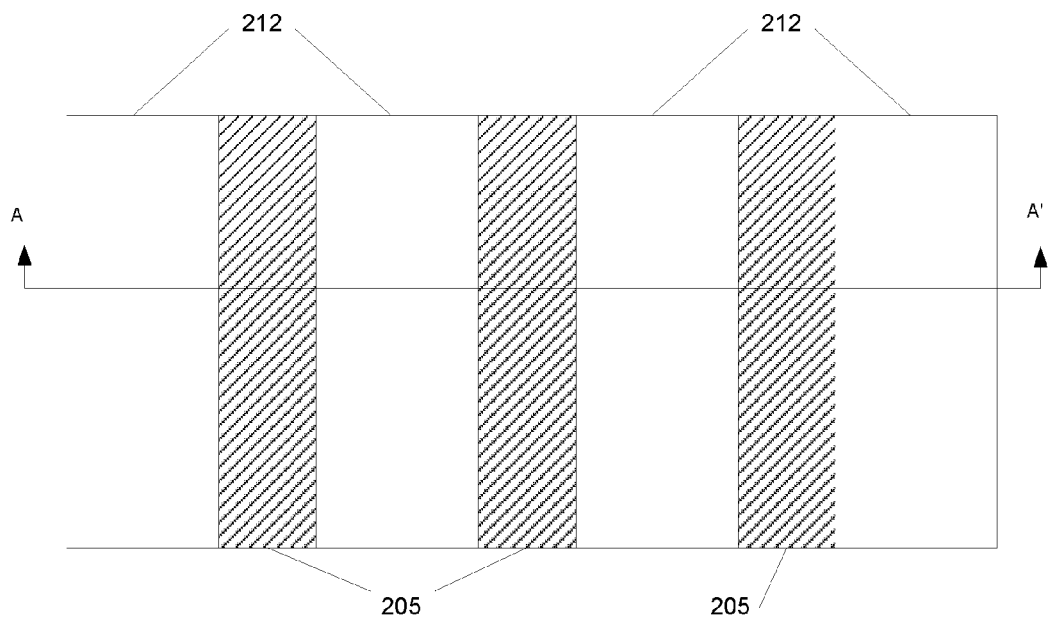

FIG. 10 is a top view of the layers formed thus far. FIG. 9 is a cross sectional view along the lines AA' of the layers illustrated in FIG. 10. Accordingly, insulating layer 202 is now covered by alternating oxide regions 212 and bitlines 205 formed from the remaining portions of semiconductor material 204.

Figure 11:
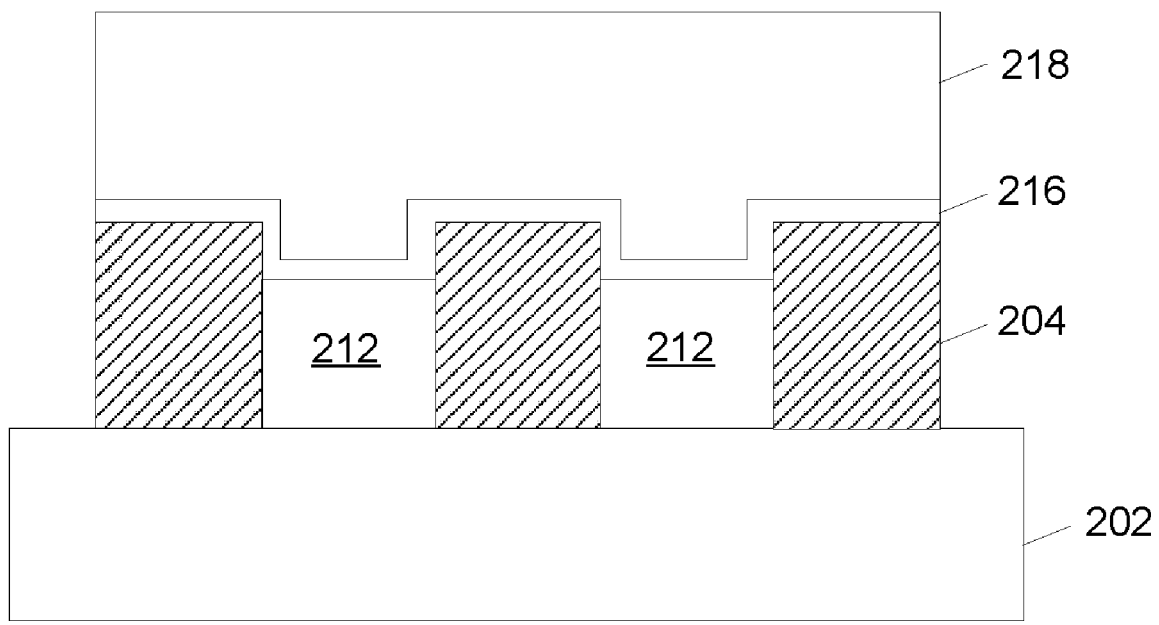

As illustrated in FIG. 11, a trapping structure 216 can then be formed over the remaining portions of semiconductor layer 204 and insulating regions 212. A word line conductor layer 218 can then be formed over trapping structure 216. A SiN layer (not shown) can then be formed over layer 218. The SiN layer (not shown) and layers 218 and 216 can then be patterned and etched using conventional photolithography techniques. The etching can be performed such that HDP oxide regions 212 act as a stop for the etching process. Another HDP oxide layer can then be formed over the etched layers, including the SiN layer (not shown). The HDP layer can then be partially etched and then part of the HDP oxide layer can be removed along with the remaining SiN layer (not shown) in a manner similar as that illustrated in FIGS. 6-9, to form word lines 219 illustrated in FIG. 12.

In the example of FIG. 11, trapping structure 216 can comprise a multi-layered structure. Examples of multi-layered structures are described more fully below with respect to FIGS. 18A-18H. Thus, trapping structure 216 can be formed by sequentially forming the layers comprising trapping structure 216.

Word line conductor layer 218 can be formed from an N+ or P+ conductor material, such as a polysilicon material, polysilicon/silicide/polysilicon material, or a metal such as aluminum (Al), copper (Cu), or Tungsten (W).

FIG. 12 is a diagram illustrating a top view of the layers as formed thus far. Accordingly, wordlines 219 are illustrated as overlapping bit lines 205. FIG. 13 is a diagram illustrating a cross-sectional view of the layers illustrated in FIG. 12 along the lines AA'. FIG. 14 is a diagram illustrating a cross-sectional view of the layers illustrated in FIG. 12 along the line BB'.

Figure 15:
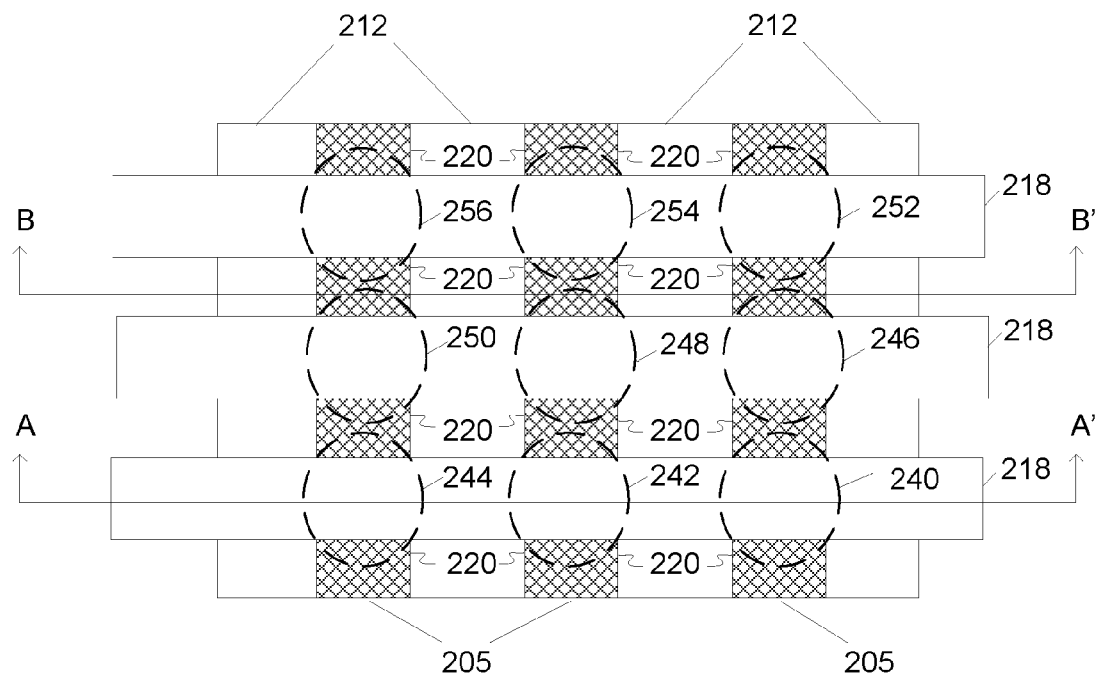

As illustrated in FIG. 15, once wordlines 219 are formed over bit lines 205, source and drain regions 220 can be formed in the areas of semiconductor layer 204 comprising bit lines 205 that are not covered by word line conductors 218. Accordingly, source and drain regions 220 can be implanted and heat-driven in the regions 220 of semiconductor layer 204. As will be understood, the process of implanting source and drain regions 220 is a self-aligned process. In the example of FIG. 15, the source and drain regions should be N+ regions formed using, e.g., arsenic (As), or phosphorous (P), since semiconductor layer 204 comprises P-type semiconductor material. It will be understood that P+ regions should be formed in embodiments that use N-type semiconductor material.

After formation of source and drain regions 220, semiconductor layer 204 will comprise source/drain regions 220 which are N+ region, and P-type regions under word line conductor 218. As explained below, these P-type regions will form the channel regions for particular memory cells.

Figure 16:
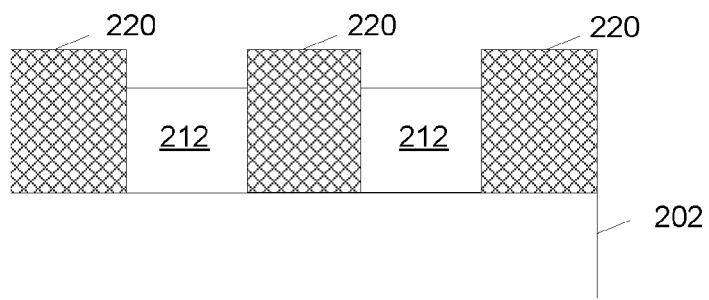

FIG. 16 is a cross-sectional view of the layers formed thus far along the line BB'. As can be seen, N+ source/drain regions 220 are formed between wordlines 219 and are separated by dielectric regions 212. FIG. 13 still illustrates a cross-sectional view of the layers formed thus far along the line AA'. As can be seen, layer 204 still comprises P-type regions 221 under word line conductor 218.

The layers formed thus far will then form non-volatile memory cells 240-256. The source and drain regions for non-volatile memory cells 240-256 are formed from the N+ source/drain regions 220 on either side of the associated wordlines 219. Referring to FIG. 13, the areas 221 of polysilicon layer 204 forming bit lines 205 under wordlines 219 form the channel regions for non-volatile memory cells 240-256. Trapping structure 216 above these channel regions are used to store charge in each of cells 240-256. The charge trapping structures are described more fully below with respect to FIGS. 18A-18H.

Accordingly, by applying the correct voltages to word line conductors 218 and source/drain regions 220, charge can be stored in trapping structure 216 of the appropriate cells 240-256. Similarly, cells 240-256 can be erased by applying the appropriate voltages to word line conductors 218 and the associated source/drain regions 220. The programming status of cells 240-256 can also be read by applying the appropriate voltages to the appropriate word line conductors 218 and source/drain regions 220.

Figure 17:
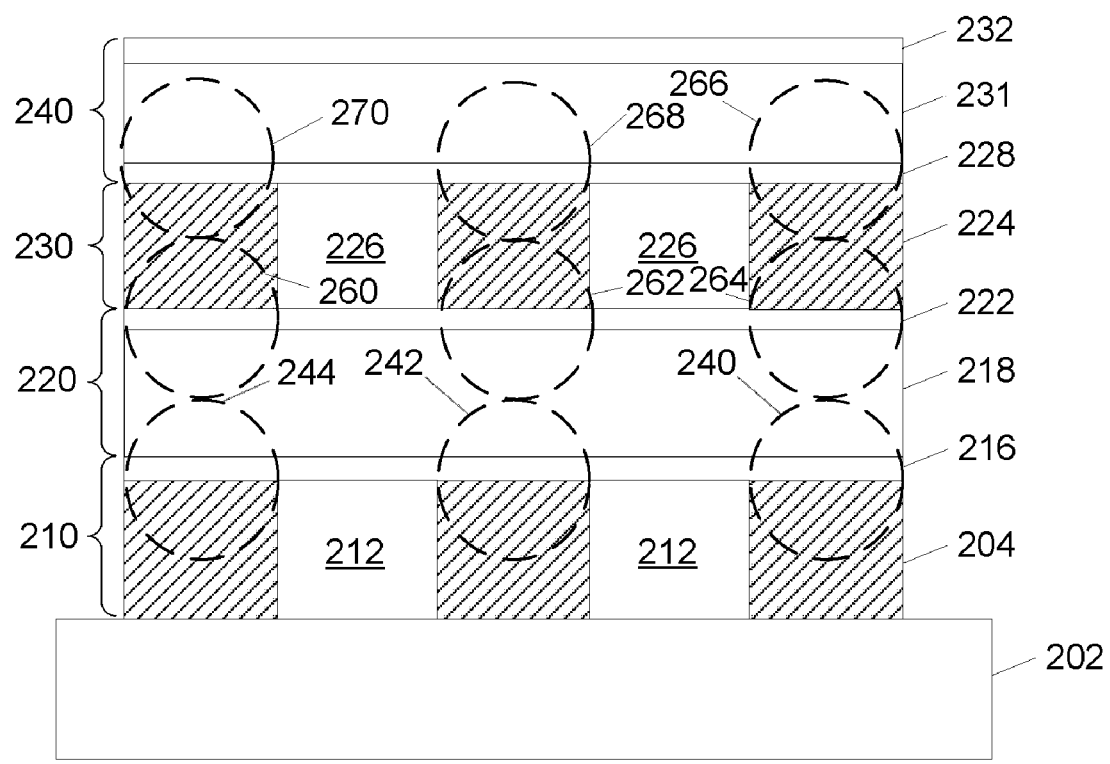

As illustrated in FIG. 17, additional memory cells 260-270 can be formed by forming additional bit line and word line layers over bit line and word line layers 210 and 220 respectively. Thus, an additional trapping structure 222 can be formed over word line conductor 218, and then an additional bit line layer 230 can be formed on trapping structure 222. Bit line layer 230 can be formed using the same steps illustrated above for forming bit line layer 210. Accordingly, bit line layer 230 will comprise the remaining portions of an etched polysilicon layer 224, wherein the remaining portions are separated by dielectric regions 226. The remaining portions of polysilicon layer 224 illustrated in FIG. 17, which reside under the wordlines of word line layer 240, can form the channel regions for additional cells 260-270.

Source and drain regions can be implanted into the remaining portions of polysilicon layer 224, that reside on either side of the word lines of word line layer 240.

Word line layer 240 can be formed over bit line layer 230 by forming a trapping structure 228 over the remaining portions of polysilicon layer 224 and dielectric regions 226, forming a word line conductor layer 231 over trapping structure 228, and then forming a trapping structure 232 over word line conductor 231. Again, word line layer 240 can be formed using the same processing techniques described above with regard to word line layer 220. Memory cells 240-244 from FIG. 15 are illustrated in FIG. 17. Thus, additional memory cells 260-270 are formed in the layers above cells 240-244. It will be understood, however, that a device fabricated in accordance with the systems and methods described herein can comprise any number of layers and any number of cells.

Because of the efficient processing techniques used to form the word line and bit line layers, the process can be scaled to accommodate any number of layers. Thus, it will be understood that two bit line, and two word line layers are illustrated in FIG. 17 by way of convenience only.

Figure 18A:
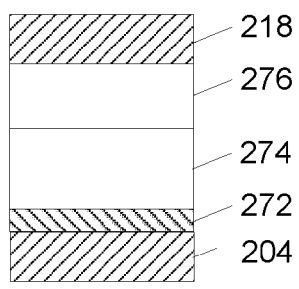
FIGS. 18A-18H are diagrams illustrating different embodiments for a trapping structure that can be included in the device of FIG. 2.

FIGS. 18A-18H are diagrams illustrating example embodiments of various trapping structures that could be used in device 100. For example, referring back to FIG. 11, the structures illustrated in FIGS. 18A-18H can be used for trapping structure 216. The first example embodiment illustrated in FIG. 18A comprises a Silicon-Oxide-Nitride-Oxide-Silicon (SONOS) structure. This structure comprises an oxide layer 272, nitride layer 274, and oxide layer 276 sequentially formed over polysilicon layer 204. Oxide region 272 acts as a tunnel dielectric layer and nitride layer 274 acts as a trapping layer for trapping charge. When the SONOS structure of FIG. 18A is used, charge is stored in trapping structure 274 of a particular cell by injection of holes into trapping layer 274. A cell can be erased through the direct tunneling of holes into trapping structure 274, where they compensate for any electrons previously stored in trapping structure 274. The tunneling of holes in the trapping structure 274 is achieved via Fowler-Nordheim tunneling. Oxide layer 272 can be a thin oxide layer, e.g., less than 3 nanometers thick. Cells formed using the SONOS trapping structure illustrated in FIG. 18A can, e.g., be used for NAND memory applications.

NAND devices constructed using the SONOS trapping structure illustrated in FIG. 18A, can exhibit somewhat poorer charge retention due to leakage current that results from the direct tunneling of holes into trapping layer 274 during charge retention.

Figure 18B:
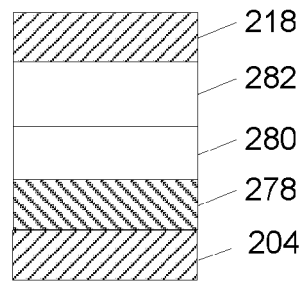

FIG. 18B illustrates a nitride read only memory trapping structure. Again, the nitride read only memory trapping structure comprises an ONO structure formed by sequentially forming an oxide layer 278, nitride layer 280, and a second oxide layer 282, over polysilicon region 204. Here, however, oxide layer 278 comprises a thickness in the range of approximately 5-7 nanometers. A cell formed using the nitride read only memory structure of FIG. 18B is programmed via injection of electrons into layer 280. A cell formed using the nitride read only memory structure of FIG. 18B can then be erased via hot hole erase techniques. The nitride read only memory structure of FIG. 18B can be used for NOR applications; however, devices constructed using the nitride read only memory structure of FIG. 18B exhibits some degradation due to the hot hole erase procedure.

Figure 18C:
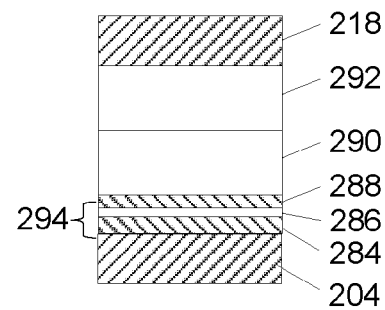

FIG. 18C is a diagram illustrating a band-gap engineered (BE)—SONOS structure. The BE-SONOS structure of FIG. 18C is fabricated by sequentially forming an ONO structure 294 followed by a nitride layer 290 and a dielectric layer 292. ONO structure 294 is thus formed by sequentially forming an oxide layer 284, nitride layer 286, and an oxide layer 288 over polysilicon layer 204. As with the SONOS structure of FIG. 18A, the BE-SONOS structure of FIG. 18C uses Fowler-Nordheim hole tunneling to erase the memory cells; however, the BE-SONOS structure of FIG. 18C does not exhibit the poor retention that results from direct tunneling leakage, or device degradation that results from hot hole erase damage. Further, the BE-SONOS structure of 18C can be used for both NOR and NAND applications.

Figure 19A:
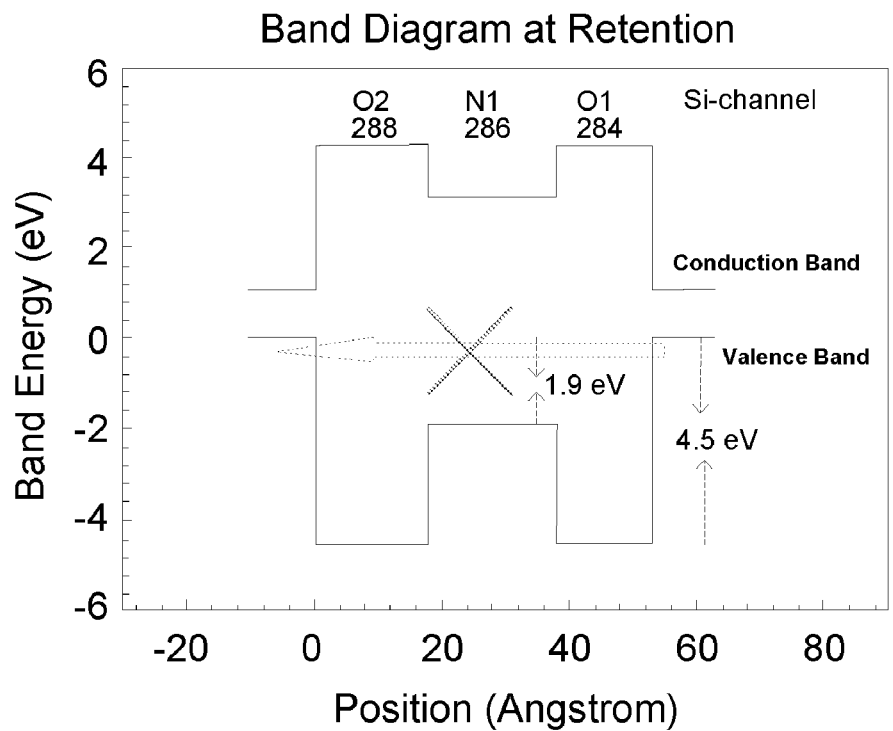
FIGS. 19A and 19B are band diagrams for the trapping structure of FIG. 18C.
Figure 19B:
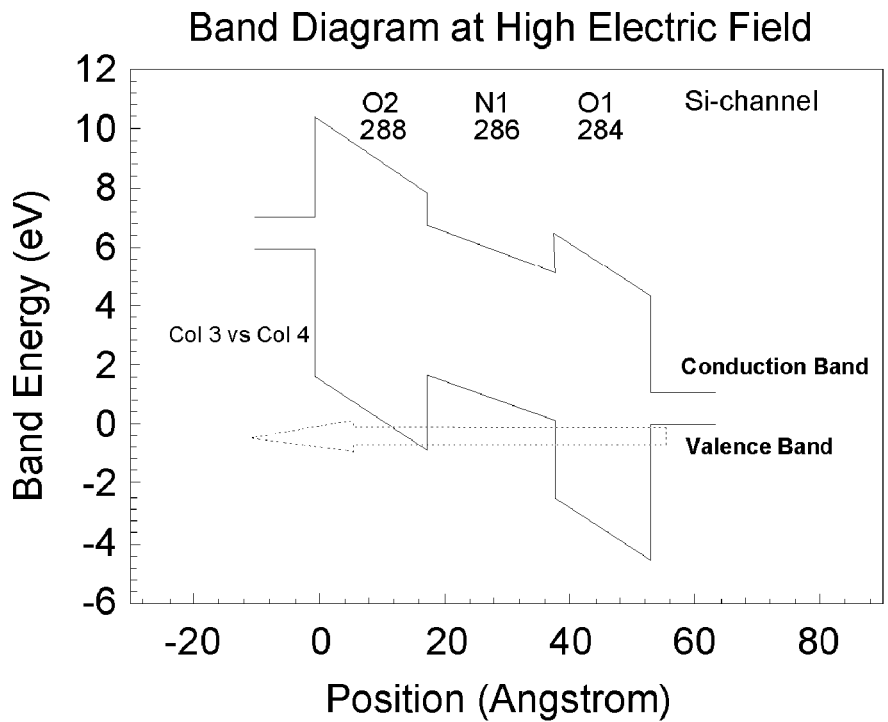

FIGS. 19A and 19B are band diagrams illustrating the bands for ONO structure 294, of the BE-SONOS structure illustrated in FIG. 18C. FIG. 19A is a band diagram during data retention, and FIG. 19B is a band diagram during erase. As can be seen in FIG. 19A, during retention holes do not have sufficient energy to overcome the potential barriers of the layers comprising ONO structure 294. Data retention occurs when a low electric field exists across trapping structure 294. Because tunneling of holes is blocked by structure 294, there is little tunneling leakage during application of a low field. As illustrated in FIG. 19B, however, when a high field exists across trapping structure 294, the bands shift allowing holes to tunnel across structure 294. This is because the barriers presented by layers 286 and 288 are almost eliminated from the perspective of the holes, due to the band shift when a high field is present.

Figure 18D:
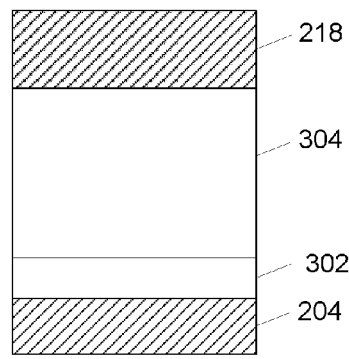

FIGS. 18D-18H illustrate other example structures that can be used for the trapping layers included in device 100. For example, FIG. 18D is a diagram illustrating a SONS structure that can be used for the trapping layers included in device 100. The structure illustrated in FIG. 18D comprises a thin oxide layer 302 formed over polysilicon layer 204. A nitride layer 304 is then formed over the thin oxide layer 302. Gate conducting layer 218 can then be formed over nitride layer 304. Thin oxide layer 302 acts as the tunnel dielectric and charge can be stored in nitride layer 304.

Figure 18E:
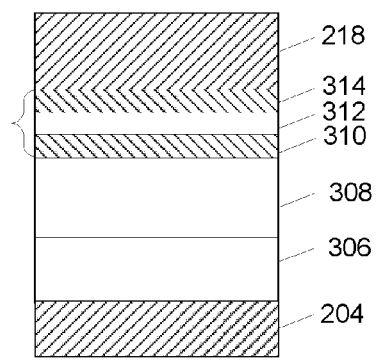

FIG. 18E is an example of a top BE-SONOS structure that can be used for trapping layers included in device 100. Accordingly, the structure illustrated in FIG. 18E comprises an oxide layer 306 formed over polysilicon layer 204. A nitride layer 308 is then formed over oxide layer 306, and ONO Structure 315 comprising an oxide layer 310, nitride layer 312 and oxide layer 314 is then formed over nitride layer 308. In the example of FIG. 18E, oxide layer 306 acts as the tunnel dielectric layer and charge can be trapped in nitride layer 308.

Figure 18F:
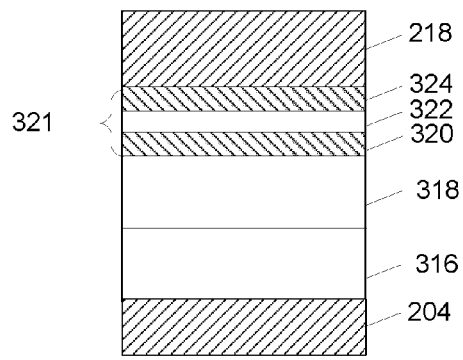

FIG. 18F is a diagram illustrating a bottom SONOSOS structure that can be used for the trapping layers included in device 100. The structure illustrated in FIG. 18F comprises an oxide layer 316 formed over polysilicon layer 204, and a nitride layer 318 formed over oxide layer 316. A thin oxide layer 320 is then formed over nitride layer 318 followed by a thin polysilicon layer 322. Another thin oxide layer 324 is then formed then over polysilicon layer 222. Accordingly, layers 320, 322 and 324 formed OSO structure 321 near gate conductor 218. In the example of FIG. 18F, oxide layer 316 can act as the tunnel dielectric and charge can be stored in nitride layer 318.

Figure 18G:
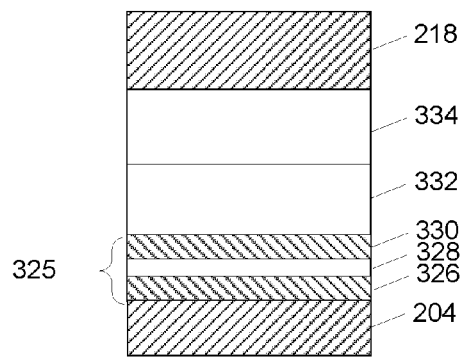

FIG. 18G is a diagram illustrating a bottom SOSONOS structure. Here, a thin OSO structure 325 is formed over polysilicon layer 204. OSO structure 325 comprises thin oxide layer 326, a thin polysilicon layer 228, and a thin oxide layer 330. A nitride layer 332 can then be formed over OSO structure 325, and an oxide layer 334 can be formed over nitride layer 332. In the example of FIG. 18G, OSO structure 325 can act as the tunnel dielectric and charge can be stored in nitride layer 332.

Figure 18H:
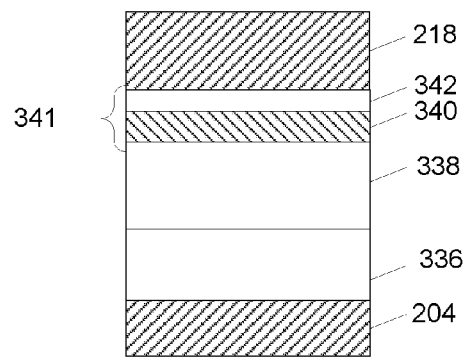

FIG. 18H is a diagram illustrating an example SONONS structure that can be used for the trapping structures included in device 100. Here, an oxide layer 336 is formed over polysilicon layer 204 and a nitride layer 338 is formed over oxide layer 336. An ON structure 341 is then formed over nitride layer 338. ON structure 341 comprises a thin oxide layer 340 formed over nitride layer 338, and a thin nitride layer 342 formed over thin oxide layer 240. In the example of FIG. 18H, oxide layer 336 can access the tunnel dielectric and charge can be trapped in nitride layer 338.

In other embodiments, the trapping structure can comprise a SiN or a SiON, or a Hi-K material such as $HfO_2$, $Al_2O_3$, AlN, etc. In general, any trapping structure or material can be used as long as it meets the requirements of a particular application.

Figure 20:
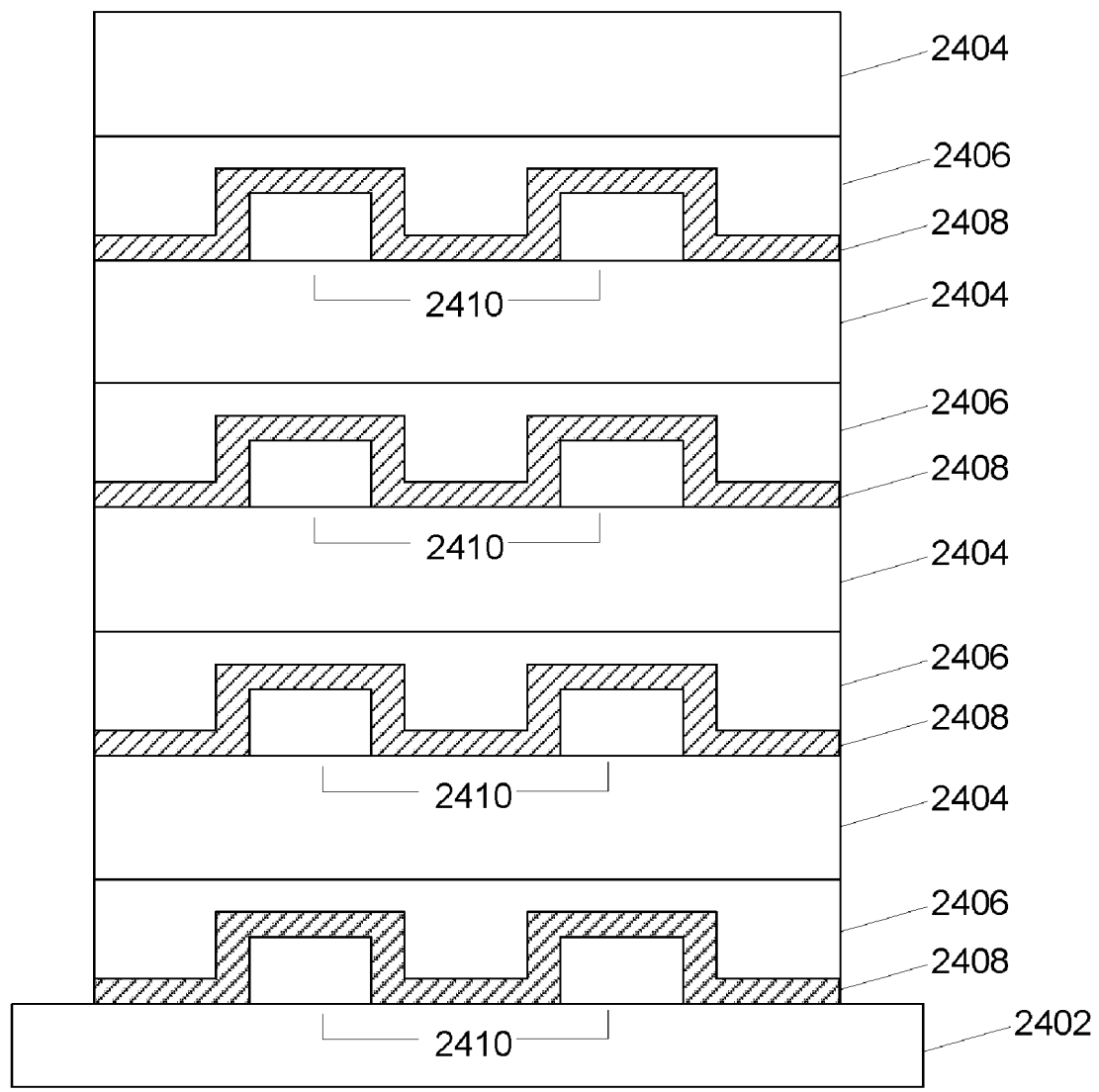
FIG. 20 is a diagram illustrating another example of a stacked non-volatile memory structure configured in accordance with one embodiment.

FIG. 20 is a diagram illustrating an examples stacked Non-volatile memory device configured in accordance with another embodiment. FIGS. 21-31 are diagrams illustrating a progression of steps for fabricating the device of FIG. 20. The embodiment described with respect to FIGS. 20-31 present a simpler design in which word lines are not shared between memory cells. As can be seen in FIG. 20, the process illustrated in FIGS. 21-31 produces a stack memory structure that comprises an insulator or dielectric layer 2402 with word line and bit line layers stack on top of insulator 2402 and separated by inter layer, or inter-module dielectric layers 2404. The word line and bit line layers comprise bit lines 2410 separated from word lines 2406 by trapping structures 2408. As described below, a bit line layer can be deposited and then patterned and etched to form bit lines 2410. A trapping structure layer can then be deposited and a word line layer can be deposited over the trapping structure layer. The word line and trapping structure layers can then be patterned and etched to form word lines over bit lines 2410. The trapping structure 2408 above bit lines 2410 and under word lines 2406 can then act as the trapping layer for storing charge in a memory cell.

Figure 21:

FIGS. 21-31 are diagrams illustrating an example process for fabricating the device illustrated in FIG. 20. As illustrated in FIG. 21, a polysilicon layer 2504 can be deposited over an insulating layer 2502. Insulating layer 2502 can comprise an oxide material, e.g., a silicon dioxide material (SiO). Polysilicon layer 2504 can have a thickness in the range of approximately 200-1,000 Å. For example, the thickness of polysilicon layer 2504 can, in certain embodiments, preferably be approximately 400 Å.

Figure 22:
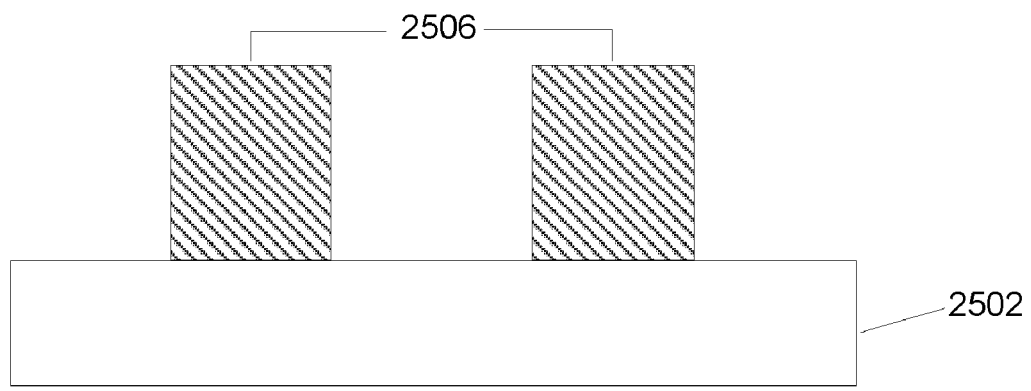

Referring to FIG. 22, polysilicon layer 2504 can then be patterned and etched using conventional photolithography processes in order to produce bit line regions 2506. For example, insulating layer 2502 can be used as an etch stop for the etching process in order to produce regions 2506. The overall thickness of the layers illustrated in FIG. 22 can be between approximately 200-1000 Å, and can prefer with the approximately 400 Å.

Figure 23A:
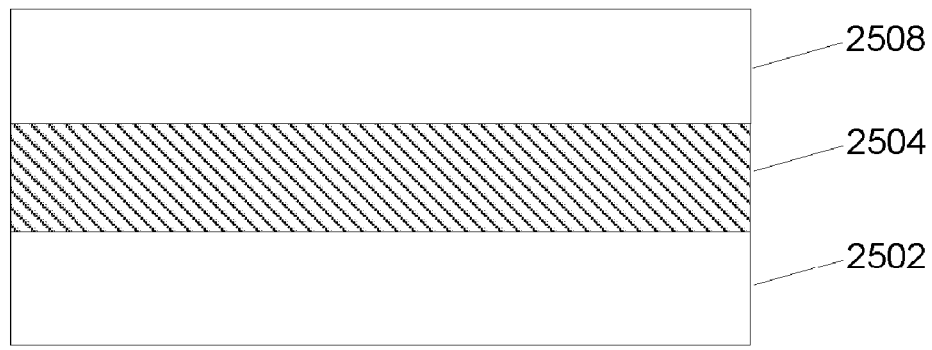
Figure 23B:
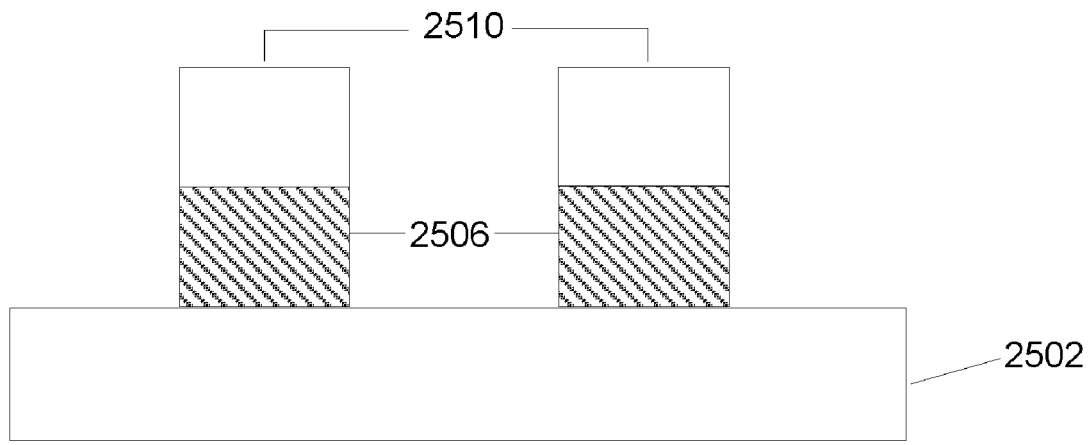
Figure 23C:
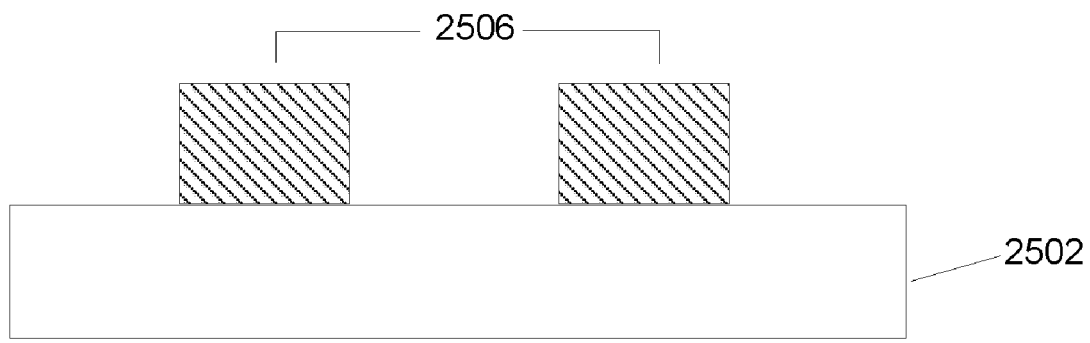

FIGS. 23A-23C, illustrate an alternative process for etching polysilicon layer 2504 in order to produce bit line regions 2506. Referring to FIG. 23A, a cap layer 2508 can be formed over polysilicon layer 2504. For example, cap layer 2508 can comprise a silicon nitride (SiN) layer. Polysilicon layer 2504 and cap layer 2508 can then be patterned and etched using conventional photolithography techniques as illustrated in FIG. 23B. Again, insulating layer 2502 can act as a etch stop for the etching process.

Referring to FIG. 23C, after layers 2504 and 2508 are etched to produce regions 2506 and 2510, and cap layer 2508, regions 2510 can be removed using conventional processes.

Figure 24:
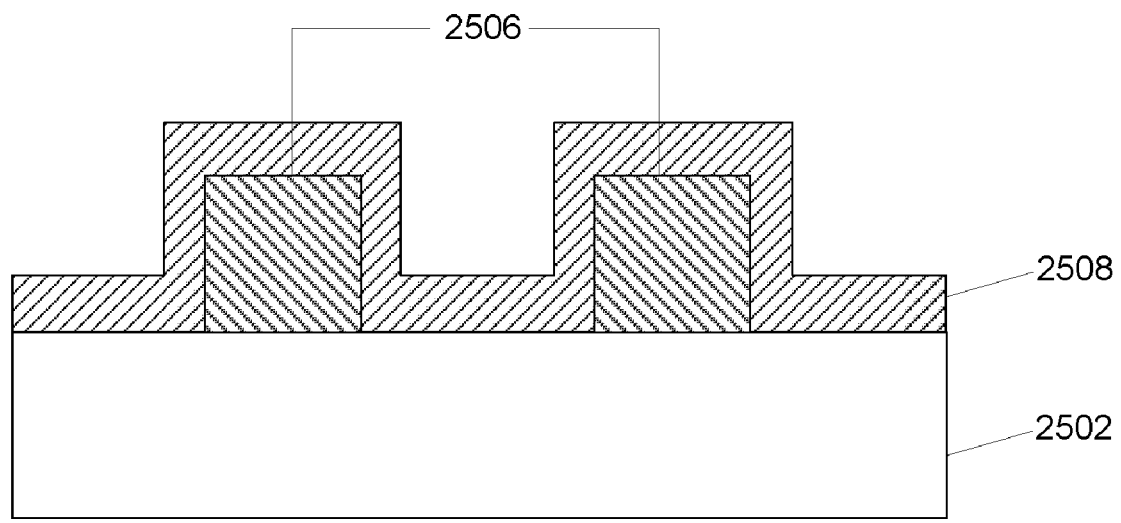

Referring to FIG. 24, a trapping structure layer 2508 can be formed over insulating layer 2502 and bit line regions 2506. As described above, trapping structure layer 2508 can comprise any of a plurality of trapping structures, such as SONOS, BE-SONOS, top BE-SONOS, SONONS, SONOSLS, SLSLNLS, etc. In other embodiments, trapping structure layer 2508 can comprise a SiN material, SiON material, or a high-K material such as $HfO_2$, $Al_2O_3$, AlN, etc.

Figure 27:
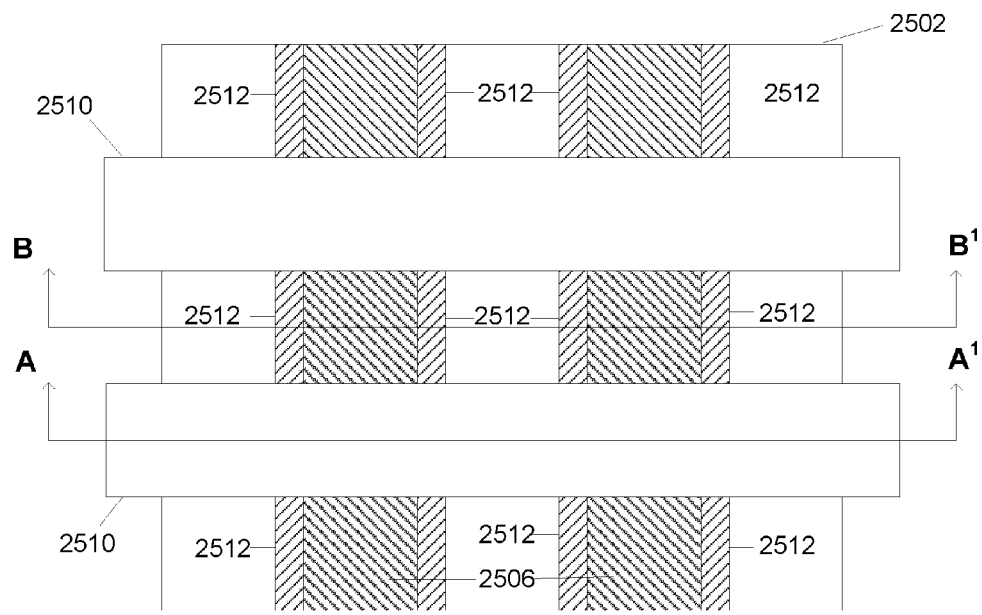
Figures 25, 26:
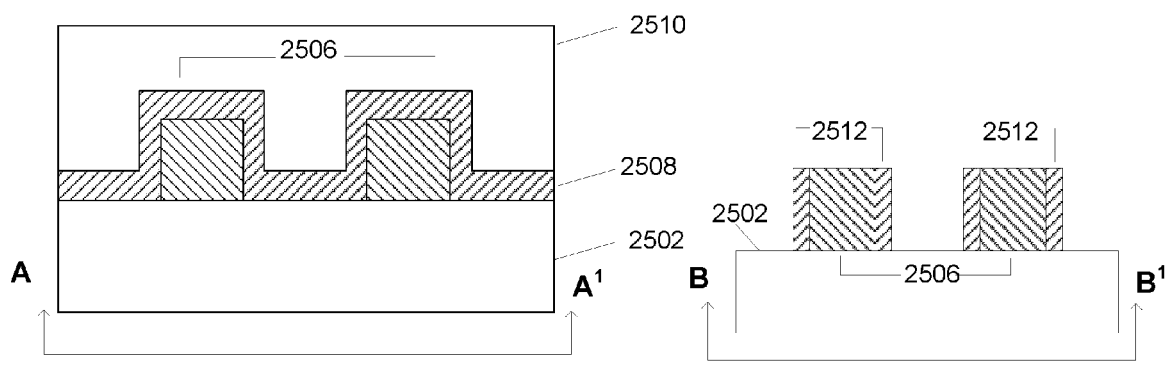

Referring to FIG. 25, a word line layer 2510 can then be formed over trapping structure layer 2508. For example, word line layer 2510 can comprise a polysilicon material deposited over trapping structure layer 2508. Layers 2510 and 2508 can then be patterned and etched using conventional photolithography techniques. As illustrated in FIG. 27, this will produce word lines 2510 over bit lines 2506.

As can be seen in FIG. 26, the etching process can be configured such that it etches through trapping structure layer 2508 in the regions in between word lines 2510. This can produce regions 2506 with regions 2512 of trapping structure layer 2508 remaining on the sides of regions 2506.

FIG. 27 is a diagram illustrating a top view of the layers as formed thus far. FIG. 25 is a diagram illustrating a cross-sectional view of the layers illustrated in FIG. 27 along the lines AA'. FIG. 26 is a diagram illustrating a cross-sectional view of the layers illustrated in FIG. 27 along the line BB'.

Referring to FIG. 30, source and drain regions 2514 can be deposited in the areas of bit lines 2506 that are not under word lines 2510. For example, if word lines 2506 are formed from a P-type polysilicon material, then N-type source/drain regions 2514 can be implanted and heat driven into the regions of bit lines 2506 that are not under word lines 2510. Alternatively, if word lines 2506 are formed from an N-type polysilicon material, then P-type source/drain regions can be implanted and heat driven into bit lines 2506.

FIG. 28 is a diagram illustrating a cross-sectional view of the layers illustrated in FIG. 30 along the line AA'. FIG. 29 is a diagram illustrating a cross-sectional view of the layers illustrated in FIG. 30 along the line BB'. Accordingly, it can be seen that bit lines 2506 now comprised channel regions 2516 under word line layer 2510. The source and drain regions 2514 are then formed on either side of word lines 2510. It will be understood, that formation of source/drain regions 2514 is a self-aligned process.

Figure 31:
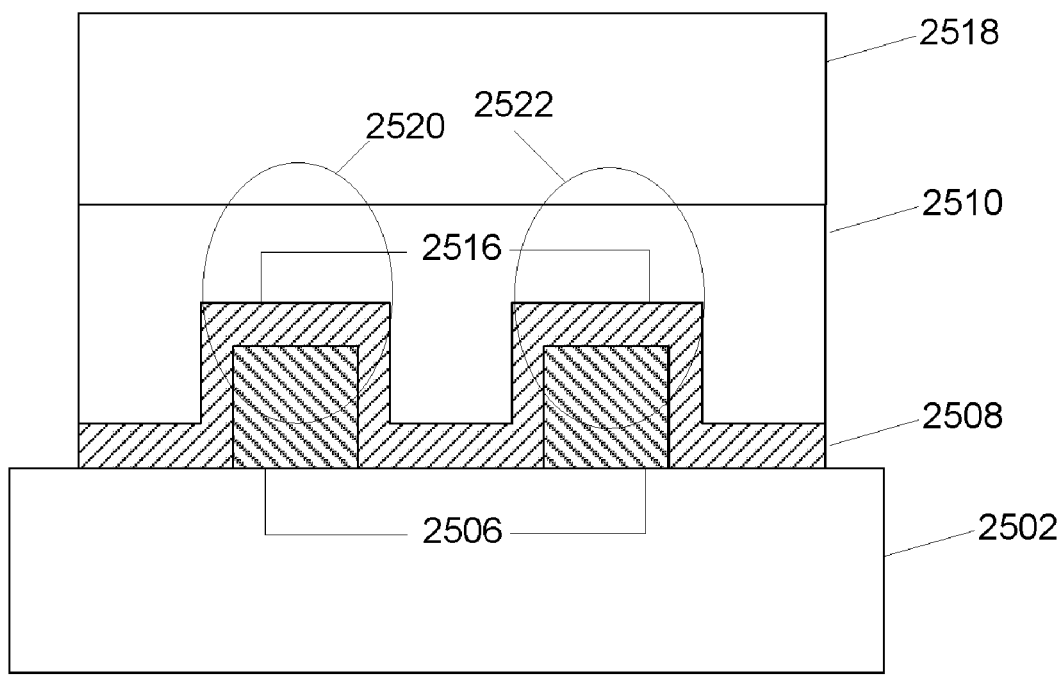

Referring to FIG. 31, an interlayer, or inter-module dielectric layer 2518 can then be formed over word line layer 2510. Another bit line and word line layer can then be formed on top of interlayer, or inter-module dielectric 2518 using the same processing steps as described above. In this manner, any number of word line and bit line layers, separated by an interlayer, or inter-module dielectric 2518 can be formed over insulating layer 2502.

Referring to FIG. 30, memory cells 2520-2526 can then be formed in the structure illustrated. Memory cells 2520 and 2522 are illustrated in FIG. 31 as well. The source and drain regions for the memory cells are formed from source/drain regions 2514 on either side of the associated word lines 2510. The channel region is formed from the regions 2516 of bit lines 2506 under word lines 2510.

It will be understood that the cells illustrated in FIGS. 30 and 31 are tri-gate devices. Tri-gate devices can exhibit excessive corner effect, but can also have increase cell current due to increased device width.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for fabricating a non-volatile memory device comprising a plurality of bitline layers and a plurality of wordline layers sequentially formed on top of each other, the method comprising:
    forming the plurality of bitline layers layer, wherein forming each bitline layer comprises:
        forming a semiconductor layer on an insulator, and
        patterning and etching the semiconductor layer to form a plurality of bitlines;
    forming word line layers in the plurality of wordline layers over respective preceding ones of the plurality of bitline layers, wherein forming each wordline layer comprises:
        sequentially forming a trapping structure and a conducting layer, and
        patterning and etching the trapping structure and the conducting layer to form a plurality of wordlines; and
    forming source/drain regions in regions of the plurality of bitlines not covered by the plurality of wordlines with active regions in the plurality of bit lines beneath the plurality of wordlines.

2. The method of claim 1, wherein patterning and etching the semiconductor layer comprises:
    forming a cap layer over the semiconductor layer;
    etching the cap layer and the semiconductor layer to form bitline regions comprising remaining portions of the cap layer and the semiconductor layer;
    forming a dielectric layer over the etched cap and semiconductor layers;
    etching a portion of the dielectric layer to form dielectric region between the bitline regions and on top of the remaining portions of the cap layer; and
    removing the remaining portions of the cap layer and removing the remaining portions of the dielectric layer on top of the cap layer.

3. The method of claim 2, wherein the cap layer comprises a nitride layer.

4. The method of claim 2, wherein the dielectric layer comprises silicon dioxide.

5. The method of claim 4, wherein the silicon dioxide is deposited using high density plasma, chemical vapor deposition.

6. The method of claim 1, wherein forming the trapping structure comprises forming a silicon-oxide-nitride-oxide-silicon (SONOS) structure.

7. The method of claim 1, wherein forming the trapping structure comprises forming an oxide-nitride-oxide (ONO), nitride read only memory structure.

8. The method of claim 1, wherein forming the trapping structure comprises forming a Band-gap Engineered (BE)-SONOS structure.

9. The method of claim 1, wherein forming the trapping structure comprises forming a silicon-oxide-nitride-silicon (SONS) structure.

10. The method of claim 1, wherein forming the trapping structure comprises forming a top BE-SONOS structure.

11. The method of claim 1, wherein forming the trapping structure comprises forming a top silicon-oxide-nitride-oxide-silicon-oxide-silicon (SONOSOS) structure.

12. The method of claim 1, wherein forming the trapping structure comprises forming a bottom SOSONOS structure.

13. The method of claim 1, wherein forming the trapping structure comprises forming a silicon-oxide-nitride-oxide-nitride-silicon (SONONS) structure.

14. The method of claim 1, wherein forming the trapping structure comprises forming a silicon nitride (SiN) layer.

15. The method of claim 1, wherein forming the trapping structure comprises forming a SiON layer.

16. The method of claim 1, wherein forming the trapping layer comprises depositing a Hi-K material.

17. The method of claim 16, wherein the Hi-K material is $HfO_2$, AlN, or $Al_2O_3$.

18. The method of claim 1, wherein the semiconductor layer comprises a P-type semiconductor material, and wherein forming the source drain regions comprises forming N+ regions in the P-type semiconductor material.

19. The method of claim 18, wherein the N+ regions are formed using As or P.

20. The method of claim 1, wherein the conducting layer comprises polysilicon material.

21. The method of claim 1, wherein the conducting layer comprises polysilicon/silicide/polysilicon material.

22. The method of claim 1, wherein the conducting layer comprises a metal.

23. The method of claim 22, wherein the metal is aluminum, copper, or tungsten.

24. The method of claim 1, wherein patterning and etching the trapping structure and conducting layer comprises:
    forming a cap layer over the trapping structure and conducting layer;
    etching the cap layer and the trapping structure and conducting layer to form wordline regions comprising remaining portions of the cap layer and the trapping structure and conducting layer;
    forming a dielectric layer over the etched cap and trapping structure and conducting layers;
    etching a portion of the dielectric layer to form dielectric regions between the wordlines and on top of the remaining portions of the cap layer; and
    removing the remaining portions of the cap layer and removing the portions of the dielectric layer on top of the cap layer.

25. The method of claim 24, wherein the cap layer comprises a nitride layer.

26. The method of claim 24, wherein the dielectric layer comprises silicon dioxide.

27. The method of claim 26, wherein the silicon dioxide is deposited using high density plasma, chemical vapor deposition.

28. A method for fabricating a non-volatile memory device comprising a plurality of bitline layers and a plurality of wordline layers sequentially formed on top of each other, the method comprising:
    forming the plurality of bitline layers, wherein forming each bitline layer comprises:
        forming a first semiconductor layer on an insulator,
        forming a cap layer over the semiconductor layer,
        etching the cap layer and the first semiconductor layer to form bitline regions comprising remaining portions of the cap layer and the semiconductor layer,
        forming a dielectric layer over the etched cap and semiconductor layers,
        etching a portion of the dielectric layer to form dielectric regions between the bitline regions and dielectric regions on top of the remaining portions of the cap layer, and
        removing the remaining portions of the cap layer and removing the remaining portions of the dielectric layer on top of the cap layer; and
    forming the plurality of wordline layers over a preceding one of the plurality of bitline layers, wherein forming each wordline layer comprises:
        sequentially forming a trapping structure and a conducting layer, the trapping structure comprising a multi-layer structure, and
        patterning and etching the trapping structure and the conducting layer to form a plurality of wordlines.

29. The method of claim 28, wherein the cap layer comprises a nitride layer.

30. The method of claim 28, wherein the dielectric layer comprises silicon dioxide.

31. The method of claim 30, wherein the silicon dioxide is deposited using high density plasma, chemical vapor deposition.

32. The method of claim 28, wherein forming the trapping structure comprises forming a silicon-oxide-nitride-oxide-silicon (SONOS) structure.

33. The method of claim 28, wherein forming the trapping structure comprises forming an oxide-nitride-oxide (ONO), nitride read only memory structure.

34. The method of claim 28, wherein forming the trapping structure comprises forming a Band-gap Engineered (BE)-SONOS structure.

35. The method of claim 28, wherein forming the trapping structure comprises forming a silicon-oxide-nitride-silicon (SONS) structure.

36. The method of claim 28, wherein forming the trapping structure comprises forming a top BE-SONOS structure.

37. The method of claim 28, wherein forming the trapping structure comprises forming a top silicon-oxide-nitride-oxide-silicon-oxide-silicon (SONOSOS) structure.

38. The method of claim 28, wherein forming the trapping structure comprises forming a bottom SOSONOS structure.

39. The method of claim 28, wherein forming the trapping structure comprises forming a silicon-oxide-nitride-oxide-nitride-silicon (SONONS) structure.

40. The method of claim 28, wherein forming the trapping structure comprises forming a silicon nitride (SiN) layer.

41. The method of claim 28, wherein forming the trapping structure comprises forming a SiON layer.

42. The method of claim 28, further comprising forming source/drain regions in the regions of the plurality of bitlines not covered by the plurality of wordlines.

43. The method of claim 42, wherein the semiconductor layer comprises a P-type semiconductor material, and wherein forming the source drain regions comprises forming N+ regions in the P-type semiconductor material.

44. The method of claim 43, wherein the N+ regions are formed using As or P.

45. The method of claim 28, wherein the conducting layer comprises polysilicon material.

46. The method of claim 28, wherein the conducting layer comprises polysilicon/silicide/polysilicon material.

47. The method of claim 28, wherein the conducting layer comprises a metal.

* * * * *